(12) United States Patent
Okamoto et al.

(10) Patent No.: US 10,305,460 B2
(45) Date of Patent: May 28, 2019

(54) DATA COMPARISON CIRCUIT AND SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/432,002

(22) Filed: Feb. 14, 2017

(65) Prior Publication Data
US 2017/0244398 A1 Aug. 24, 2017

(30) Foreign Application Priority Data
Feb. 23, 2016 (JP) ................................ 2016-031740

(51) Int. Cl.
| | | |
|---|---|---|
| *H03K 5/22* | (2006.01) | |
| *H03K 5/24* | (2006.01) | |
| *G11C 11/401* | (2006.01) | |
| *G11C 15/04* | (2006.01) | |
| *H03M 1/66* | (2006.01) | |

(52) U.S. Cl.
CPC .......... *H03K 5/2472* (2013.01); *G11C 11/401* (2013.01); *G11C 15/043* (2013.01); *H03M 1/66* (2013.01)

(58) Field of Classification Search
CPC ..... H03K 5/2472; H03M 1/66; G11C 11/401; G11C 15/043

USPC ........................................................ 327/63
See application file for complete search history.

(56) References Cited

U.S. PATENT DOCUMENTS

| | | | |
|---|---|---|---|
| 7,184,014 | B2 | 2/2007 | Koyama et al. |
| 7,224,339 | B2 | 5/2007 | Koyama et al. |
| 7,518,592 | B2 | 4/2009 | Koyama et al. |
| 8,564,470 | B2 * | 10/2013 | Bogner .................. H03M 1/46 341/155 |
| 8,575,960 | B2 | 11/2013 | Ohmaru et al. |
| 8,610,696 | B2 | 12/2013 | Kurokawa |
| 8,669,781 | B2 | 3/2014 | Ohmaru |
| 8,729,545 | B2 | 5/2014 | Takahashi |
| 8,760,376 | B2 | 6/2014 | Koyama et al. |
| 8,836,555 | B2 | 9/2014 | Koyama et al. |
| 8,897,049 | B2 | 11/2014 | Furutani |
| 8,908,406 | B2 | 12/2014 | Kurokawa |

(Continued)

OTHER PUBLICATIONS

Pagiamtzis.K et al., "Content-Addressable Memory (CAM) Circuits and Architectures: A Tutorial and Survey", IEEE Journal of Solid-State Circuits, Mar. 1, 2006, vol. 41, No. 3, pp. 712-727.

*Primary Examiner* — Metasebia T Retebo
(74) *Attorney, Agent, or Firm* — Fish & Richardson P.C.

(57) ABSTRACT

A semiconductor device that enables a memory size reduction is provided. The semiconductor device includes a converter circuit, a memory circuit, and a detection circuit. The converter circuit has a function of converting first data that includes a digital voltage value to second data that includes an analog current value. The memory circuit has a function of storing third data that includes an analog current value. The detection circuit has a function of generating data that indicates whether the analog current values of the second and third data match.

18 Claims, 26 Drawing Sheets

(56) References Cited

U.S. PATENT DOCUMENTS

| | | |
|---|---|---|
| 8,953,354 B2 | 2/2015 | Kurokawa |
| 8,958,231 B2 | 2/2015 | Matsubayashi |
| 9,131,171 B2 | 9/2015 | Aoki et al. |
| 9,349,454 B2 | 5/2016 | Ikeda et al. |
| 9,374,048 B2 | 6/2016 | Koyama et al. |
| 9,397,637 B2 | 7/2016 | Kozuma et al. |
| 9,569,713 B2 | 2/2017 | Yoneda et al. |
| 2012/0292614 A1 | 11/2012 | Matsubayashi |
| 2015/0348975 A1 | 12/2015 | Tamura |
| 2016/0117045 A1 | 4/2016 | Yamazaki et al. |
| 2016/0240239 A1 | 8/2016 | Ikeda et al. |
| 2016/0315600 A1 | 10/2016 | Kozuma et al. |
| 2016/0329024 A1 | 11/2016 | Maeda |
| 2016/0366360 A1 | 12/2016 | Okamoto et al. |
| 2017/0017285 A1 | 1/2017 | Kurokawa et al. |
| 2017/0094220 A1 | 3/2017 | Kurokawa |
| 2018/0068611 A1* | 3/2018 | Chaji .................. G09G 3/3233 |

* cited by examiner

30 LPF

19

33 LPF

50

12 A-MEM

11 A-DAC

DATA COMPARISON CIRCUIT AND SEMICONDUCTOR DEVICE

BACKGROUND OF THE INVENTION

1. Field of the Invention

One embodiment of the present invention relates to a semiconductor device such as a data comparison circuit.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

Content-addressable memory (CAM) has a function of comparing a specified data word with data words stored within the CAM to search for a matching data word. When the matching data word is found within the CAM, the CAM outputs an address of the matching data word. The CAM can compare a specific data word with data words stored within the CAM; thus the CAM can have a higher processing speed than random-access memory (RAM), when the CAM specializes in data comparison.

Non-Patent Document 1 given below discloses the circuit configuration of a CAM memory cell.

REFERENCE

[Non-Patent Document 1] Kostas Pagiamtzis et al., "Content-Addressable Memory (CAM) Circuits and Architectures: A Tutorial and Survey," IEEE JOURNAL OF SOLID-STATE CIRCUITS, VOL. 41, NO. 3, MARCH 2006.

SUMMARY OF THE INVENTION

The CAM described in Non-Patent Document 1 above compares one-bit data that is stored in each memory cell with the one-bit data that is input; whether the data match is determined on a per bit basis. In other words, the CAM described in Non-Patent Document 1 can only compare one bit of data per memory cell; accordingly, the number of memory cells used for comparison of data must be the same as the bit width of data to be compared. As a result, the memory size needed for comparison of data increases as the bit width of the data increases.

In addition, the CAM described in Non-Patent Document 1 has no function other than comparison of data, limiting the function of the circuit.

With the technical background such as that described above, an object of one embodiment of the present invention is to provide a data comparison circuit which enables memory size reduction. Alternatively, an object of one embodiment of the present invention is to provide a data comparison circuit that can compare data of a plurality of bits in one memory cell. Alternatively, an object of one embodiment of the present invention is to provide a data comparison circuit that can perform an operation other than comparison of data.

Alternatively, an object of one embodiment of the present invention is to provide a semiconductor device which enables memory size reduction. Alternatively, an object of one embodiment of the present invention is to provide a semiconductor device that can compare data of multiple bits in one memory cell. Alternatively, an object of one embodiment of the present invention is to provide a semiconductor device that can perform an operation other than comparison of data.

An object of one embodiment of the present invention is to provide a novel semiconductor device or the like. Note that the descriptions of these objects do not disturb the existence of other objects. One embodiment of the present invention does not need to achieve all the objects. Other objects will be apparent from and can be derived from the description of the specification, the drawings, the claims, and the like.

One embodiment of the present invention includes a converter circuit, a memory circuit, and a detection circuit. The converter circuit has a function of converting first data that includes a digital voltage value to second data that includes an analog voltage value. The memory circuit has a function of storing third data that includes an analog current value. The detection circuit has a function of generating data that indicates whether the analog current values of the second and third data match.

One embodiment of the present invention includes a converter circuit, a memory circuit, and a detection circuit. The converter circuit has a function of converting the first data that includes a digital voltage value to the second data that includes an analog voltage value. The memory circuit has a function of storing the third data that includes an analog current value. The detection circuit has a function of detecting the difference between the analog current values of the second and third data, and a function of generating data that indicates whether the analog current values of the second and third data match, from the difference.

One embodiment of the present invention includes a converter circuit, a memory circuit, and a detection circuit. The converter circuit has a function of converting the first data that includes a digital voltage value to the second data that includes an analog voltage value. The memory circuit has a function of storing the third data that includes an analog current value. The detection circuit has a function of detecting the difference between the analog current values of the second and third data, and a function of generating fourth data that includes information about the difference.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relationship, for example, a connection relationship shown in drawings or texts, another connection relationship is included in the drawings or the texts. Here, X and Y denote an object (e.g., a device, an element, a circuit, a wiring, an electrode, a terminal, a conductive film, a layer, or the like).

A transistor includes three terminals: a gate, a source, and a drain. A gate is a node that controls the conduction state of a transistor. Depending on the channel type of the transistor or levels of a potential applied to the terminals, one of two input/output nodes functions as a source and the other functions as a drain. Therefore, the terms "source" and "drain" can be used interchangeably in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential (GND) or a source potential). Thus, a voltage can also be referred to as a potential. Note that the potential indicates a relative value. Accordingly, "ground potential" does not necessarily mean 0 V.

In this specification and the like, the terms "film" and "layer" can be interchanged depending on the case or circumstances. For example, a term "conductive layer" can be changed to a term "conductive film" in some cases. For example, a term "insulating film" can be changed to a term "insulating layer" in some cases.

In this specification and the like, ordinal numbers such as first, second, and third are used to avoid confusion among components, and the terms do not limit the components numerically or do not limit the order.

According to one embodiment of the present invention, a data comparison circuit which enables memory size reduction can be provided. Alternatively, according to one embodiment of the present invention, a data comparison circuit that can compare data of multiple bits in one memory cell can be provided. Alternatively, according to one embodiment of the present invention, a data comparison circuit that can perform an operation other than comparison of data can be provided.

Alternatively, according to one embodiment of the present invention, a semiconductor device which enables memory size reduction can be provided. Alternatively, according to one embodiment of the present invention, a semiconductor device that can compare data of multiple bits in one memory cell can be provided. Alternatively, according to one embodiment of the present invention, a semiconductor device that can perform an operation other than comparison of data can be provided.

According to one embodiment of the present invention, a novel semiconductor device or the like can be provided. The descriptions of these effects do not disturb the existence of other effects, and one embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
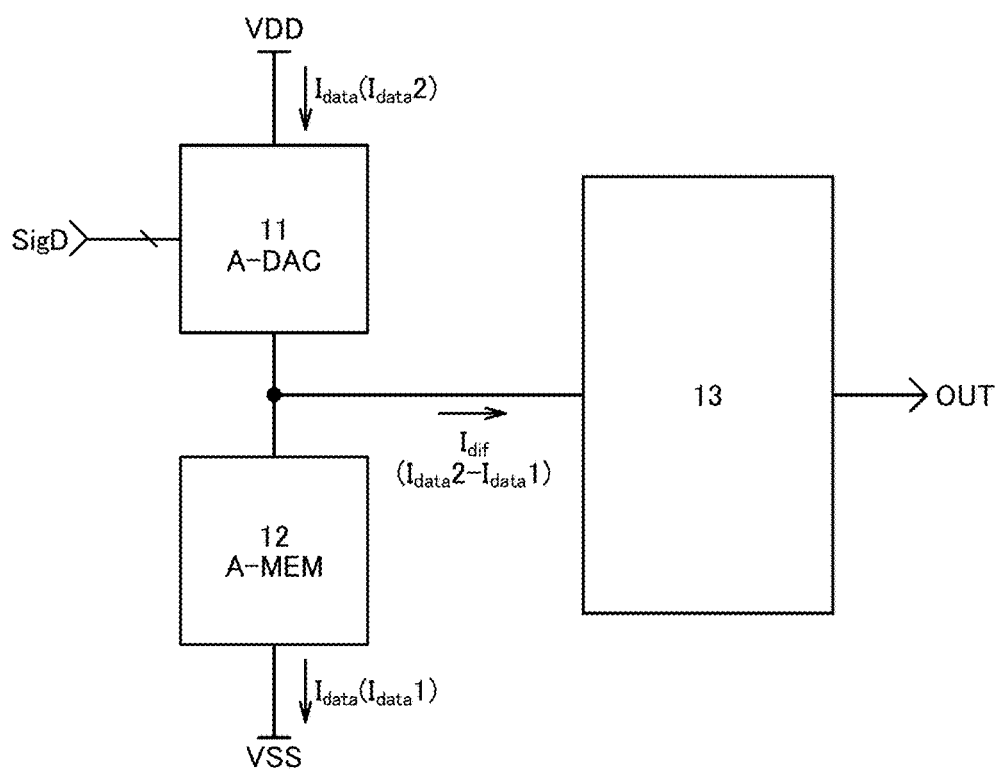
FIG. 1 illustrates a configuration of a data comparison circuit.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

(Embodiment 1)

FIG. 1 is a block diagram illustrating a configuration of a data comparison circuit according to one embodiment of the present invention, as an example. Although the block diagram shows elements classified according to their functions in independent blocks, it may be practically difficult to completely separate the elements according to their functions and, in some cases, one element may be involved in a plurality of functions.

A data comparison circuit 10 illustrated in FIG. 1 includes a converter circuit 11 (A-DAC), a memory circuit 12 (A-MEM), and a detection circuit 13. The converter circuit 11 has a function of converting digital data that includes a digital voltage value to analog data that includes an analog current value. Specifically, a signal SigD that includes the digital data is input to the converter circuit 11 illustrated in FIG. 1. The converter circuit 11 also has a function of converting the digital data included in the signal SigD to a current $I_{data}$ that includes the analog data.

The memory circuit 12 has a function of storing analog data that is input from the converter circuit 11. Specifically, the memory circuit 12 has a function of storing the current value included in the current $I_{data}$ when the current $I_{data}$ that includes the analog data is input from the converter circuit 11.

The detection circuit 13 has a function of comparing the current value of the current $I_{data}$ obtained in the converter circuit 11 with the current value of the current $I_{data}$ stored in the memory circuit 12, and generating data that includes the results of the comparison. Specifically, the detection circuit 13 has a function of generating data that indicates whether the two current values match. Whether the two current values match can be determined by detecting a difference between the two current values, for example. Alternatively, the detection circuit 13 has a function of detecting the difference between the two current values and a function of generating data using the difference.

The operation of the data comparison circuit 10 under the following circumstance is described, as an example: the current value of the current $I_{data}$ is stored in the memory circuit 12, and the detection circuit 13 compares the current value of the current bawl with the current $I_{data}2$, which is obtained in the converter circuit 11. In this case, a current $I_{dif}$ which is the difference between the current $I_{data}1$ and the current $I_{data}2$, is input to the detection circuit 13. The relationship between the current values of the currents $I_{dif}$, $I_{data}1$, and $I_{data}2$ is expressed as follows: $I_{dif}=I_{data}2-I_{data}1$.

The detection circuit 13 can generate data that indicates whether the two currents match by detecting the current value of $I_{dif}$. In addition, the detection circuit 13 can generate data that corresponds to the current value of $I_{dif}$ from the current value of $I_{dif}$. The generated data is output from an output terminal (OUT) of the detection circuit 13.

In other words, in the data comparison circuit illustrated in FIG. 1 compares two digital data that have been converted into analog data including an analog current value. When digital data are directly compared, whether the data match needs to be determined on a per bit basis. In one embodiment of the present invention, the configuration described above eliminates the necessity to compare data on a per bit basis.

Next, a configuration example of the converter circuit 11 is described with reference to FIG. 2. The converter circuit 11 illustrated in FIG. 2 includes a switch circuit 14 and a current-mirror circuit 15. The switch circuit 14 and the current-mirror circuit 15 are electrically connected between a node (wiring) that is supplied with a power supply voltage VSS and a node (wiring) that is supplied with a power supply voltage VDD. The power supply voltage VDD is higher than the power supply voltage VSS.

In the switch circuit 14, the conduction states of a plurality of current routes are controlled with a plurality of switches. Specifically, a switch circuit that is compatible with a 4-bit signal SigD is illustrated in FIG. 2 as an example of the switch circuit 14, and the switch circuit 14 includes transistors M0 to M3 that each correspond to each bit of digital data. Note that FIG. 2 illustrates an example in which all of the transistors M0 to M3 included in the switch circuit 14 are n-channel transistors; however, the transistors M0 to M3 may be p-channel transistors.

In the transistors M0 to M3, one of a source and a drain in each transistor is electrically connected to each other, and the other of the source and the drain in each transistor is electrically connected to each other. In addition, one of a source and a drain in each of the transistors M0 to M3 is each electrically connected to the current-mirror circuit 15, and the other of the source and the drain in each of the transistors M0 to M3 is each electrically connected to the node (wiring) that is supplied with the power supply voltage VSS.

Gates of the transistors M0, M1, M2 and M3 are supplied with a potential of the least significant bit D[0] of the digital data, a potential of the second bit D[1] of the digital data, a potential of the third bit D[2] of the digital data, and a potential of the most significant bit D[3] of the digital data, respectively.

Among the transistors M0 to M3, the drain current of a transistor corresponding to a high-order bit is preferably configured to be larger. For example, when the current value of the drain current of the transistor M0 is assumed to be Id, the linearity of the current value obtained from the value of the input digital data can be increased by configuring the current values of the drain currents of the transistors M1, M2 and M3 as 2×Id, 4×Id, and 8×Id, respectively.

For example, when digital data of n bits is to be converted into analog data, the switch circuit 14 includes n transistors, that is, the transistor M0 to a transistor M(n−1). Furthermore, a potential of a (t+1)-th bit D[t] of the digital data is supplied to a gate of a transistor Mt (t is an integer greater than or equal to 0 and less than or equal to n−1). In addition, when the drain current of the transistor M0 is assumed as Id, the drain current of the transistor Mt may be configured to be $2^t \times Id$.

A drain current of a transistor can be controlled by adjusting the size of a channel width W. For example, when the channel width W of the transistor M0 is assumed as X, the linearity of the current value obtained from the value of the input digital data can be increased by setting the channel widths W of the transistors M1, M2 and M3 to 2 X, 4 X, and 8 X, respectively.

In the switch circuit 14, the conduction states of the transistors M0 to M3 is controlled in accordance with the value of the digital data, thereby determining the current value of a current $I_{data}'$ that flows through the switch circuit 14. Accordingly, it can be said that the current value of the current $I_{data}'$ reflects the value of the digital data, and that the switch circuit 14 converts the signal SigD that includes a digital voltage value to the current $I_{data}'$ that includes an analog current value.

For example, D[0]=1, D[1]=0, D[2]=1 and D[3]=0 are assumed. In this case, the transistor M0 is turned on; the transistor M1 is turned off; the transistor M2 is turned on; and the transistor M3 is turned off. Accordingly, when the current value of the drain current during a period when only the transistor M0 is turned on is assumed as Id, the current value of the current $I_{data}'$ can be expressed as follows: $I_{data}'=Id+4\times Id=5\times Id$.

Each of the transistors M0 to M3 is operated preferably in a saturation region as this allows the current value of the drain current to be independent of the voltage applied between the source and the drain.

The current-mirror circuit 15 has a function of outputting the current $I_{data}$ that includes the same current value as the current $I_{data}'$ that flows across the switch circuit 14, or outputting the current $I_{data}$ that includes a current value that corresponds to the current $I_{data}'$. Specifically, FIG. 2 illustrates a case where the current-mirror circuit 15 includes transistors M4 and M5. Note that FIG. 2 illustrates an example in which the transistors M4 and M5 that are included in the current-mirror circuit 15 are p-channel transistors, but the transistors M4 and M5 may be n-channel transistors.

In both of the transistors M4 and M5, one of a source and a drain is electrically connected to the node (wiring) that is supplied with the power supply voltage VDD. The other of the source and the drain of the transistor M4 is electrically connected to the switch circuit 14. Furthermore, the other of the source and the drain of the transistor M5 is electrically connected to a terminal Ter1. The gates of the transistors M4 and M5 are electrically connected to each other, and the gate of the transistor M4 is electrically connected to the other of the source and the drain of the transistor M4.

The current $I_{data}'$ that flows across the switch circuit 14 flows between the node (wiring) that is supplied with the power supply voltage VDD and the node (wiring) that is supplied with a power supply voltage VSS, through the transistor M4 of the current-mirror circuit 15. The current-mirror circuit 15 has a function of supplying the current $I_{data}$ that includes the same current value as the current $I_{data}'$ or supplying the current $I_{data}$ that includes a current value that corresponds to the current $I_{data}'$ between the node (wiring) that is supplied with the power supply voltage VDD and the terminal Ter1, through the transistor M5.

Note that a relation between the current values of the currents that flow through the transistors M4 and M5 changes according to the ratio (L/W) of the channel length L to the channel width W of the transistor M4. If the transistors M4 and M5 have substantially the same electrical characteristics (e.g., mobility) and substantially the same ratio (L/W), the current values of the currents that flow through the transistors M4 and M5 become substantially the same.

In the descriptions below, for ease of description, it is assumed that the current values of the currents that flow through the transistors M4 and M5 are substantially the same. The current $I_{data}$ that includes the same current value as the current $I_{data}'$ that flows across the switch circuit 14 is supplied to the terminal Ter1 from the current-mirror circuit 15.

Next, a specific configuration example of the memory circuit 12 is described with reference to FIGS. 3A and 3B, FIGS. 4A and 4B, FIG. 5, and FIG. 6.

Figure 3A:
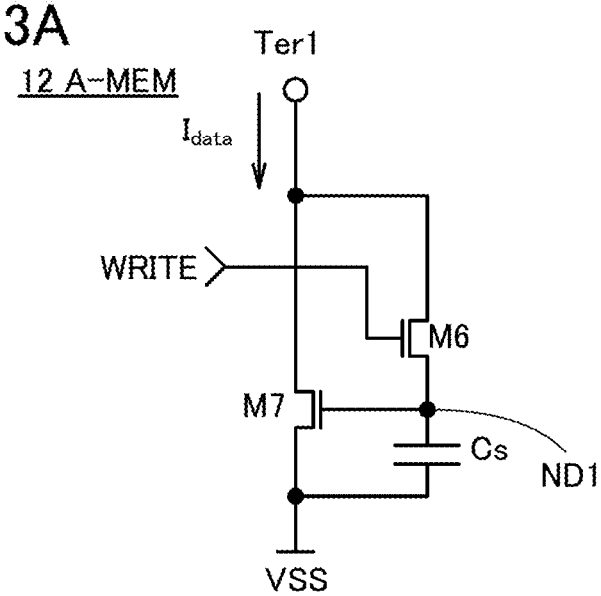
FIGS. 3A and 3B each illustrate a configuration of a memory circuit.

The memory circuit 12 illustrated in FIG. 3A includes transistors M6 and M7 and a capacitor Cs. A signal WRITE is input to a gate of the transistor M6. One of a source and a drain of the transistor M6 is electrically connected to one of a source and a drain of the transistor M7. The other of the source and the drain of the transistor M6 is electrically connected to the gate of the transistor M7 and one electrode of the capacitor Cs. The other of the source and the drain of the transistor M7 is electrically connected to the other electrode of the capacitor Cs and the node (wiring) that is supplied with the power supply voltage VSS.

Note that FIG. 3A illustrates an example where the transistors M6 and M7 are n-channel transistors.

The current $I_{data}$ from the converter circuit 11 is supplied through the terminal Ter1 to the one of the source and the drain of each of the transistors M6 and M7. When the current $I_{data}$ is written into the memory circuit 12, the transistor M6 is turned on by controlling the potential of the signal WRITE. When the transistor M6 is on, the one of the source and the drain of the transistor M7 is electrically connected to the gate of the transistor M7 through the transistor M6.

Thus, when the gate of the transistor M7 is designated as a node ND1, turning the transistor M6 on causes the potential at the node ND1 to gradually increase. Then, the potential at the node ND1 is determined at a level where the drain current of the transistor M7 is $I_{data}$ and the level of the gate voltage of the transistor M7 corresponds to the drain current. The potential described above is designated as $V_{data}$ here. The capacitor Cs has a function of retaining the potential $V_{data}$.

After the potential at the node ND1 is determined at the potential $V_{data}$, the transistor M6 is turned off by controlling the potential of the signal WRITE. Turning the transistor M6 off brings the node ND1 into a floating state, thereby retaining the potential $V_{data}$ at the node ND1. The potential $V_{data}$ is analog data that includes an analog voltage value. The memory circuit 12 can store analog data that includes an analog current value by converting the analog data that includes the analog current value to analog data that includes an analog voltage value, and retaining the voltage value at the node ND1 that is in a floating state.

Note that a transistor with low off-state current is preferably used as the transistor M6. In addition, a transistor with less gate leakage than the transistor M6, such as a transistor with a thicker gate insulating film than the transistor M6, is preferably used as the transistor M7.

Figure 3B:
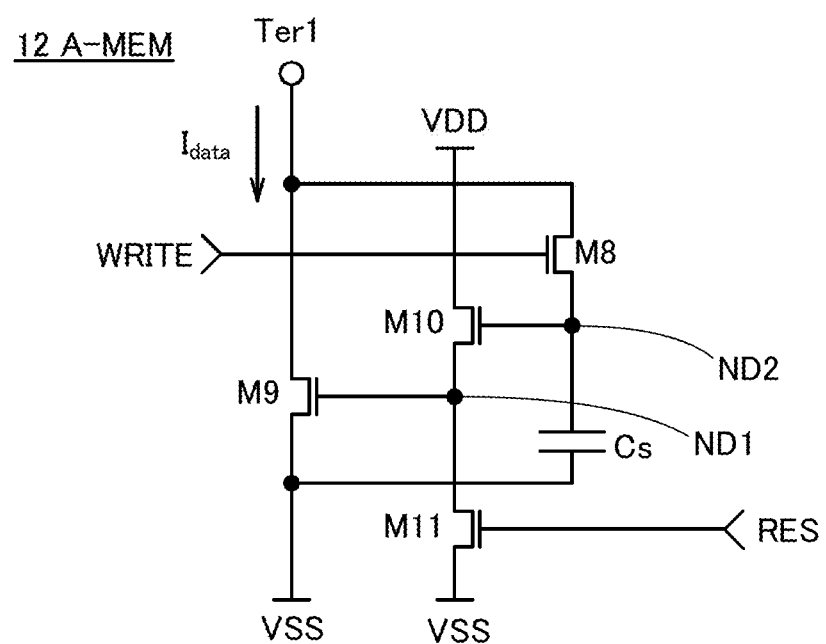

The memory circuit 12 illustrated in FIG. 3B includes transistors M8 to M11, and the capacitor Cs. The signal WRITE is input to a gate of the transistor M8. One of a source and a drain of the transistor M8 is electrically connected to one of a source and a drain of the transistor M9. The other of the source and the drain of the transistor M8 is electrically connected to a gate of the transistor M10 and one electrode of the capacitor Cs. The other of the source and the drain of the transistor M9 is electrically connected to the other electrode of the capacitor Cs and the node (wiring) that is supplied with the power supply voltage VSS. One of a source and a drain of the transistor M10 is electrically connected to the node (wiring) that is supplied with the power supply voltage VDD. The other of the source and the drain of the transistor M10 is electrically connected to a gate of the transistor M9 and one of a source and a drain of the transistor M11. The other of the source and the drain of the transistor M11 is electrically connected to the node (wiring)

that is supplied with the power supply voltage VSS. A signal RES is input to a gate of the transistor M11.

Note that FIG. 3B illustrates an example where the transistors M8 to M11 are n-channel transistors.

The current $I_{data}$ from the converter circuit 11 is supplied through the terminal Ter1 to the one of the source and the drain of each of the transistors M8 and M9. When the gate of the transistor M9 is designated as the node ND1, before the current $I_{data}$ is written into the memory circuit 12, a potential at the node ND1 is reset by controlling the potential of the signal RES to turn the transistor M11 on. Next, after the potential of the signal RES is controlled to turn the transistor M11 off, the potential of the signal WRITE is controlled to turn the transistor M8 on. Turning the transistor M8 on causes the potential at a node ND2 to gradually increase, which then turns the transistor M10 on. When the gate of the transistor M9 is designated as the node ND1, turning on the transistor M10 causes the potential at the node ND1 to gradually increase. The increase of the potential at the node ND1 turns the transistor M9 on.

When the transistor M9 is turned on, the drain current of the transistor M9 increases until the drain current becomes $I_{data}$. Then, the potential at the node ND1 is determined so that the level of the gate voltage of the transistor M9 corresponds to the drain current. The potential described above is designated as $V_{data}$ here. Note that the power supply voltage VDD is supplied to the one of the source and the drain of the transistor M10. Accordingly, the potential at the node ND1 at its maximum would take a value lower than the potential at the node ND2 by the threshold voltage value of the transistor M10.

After the potential at the node ND1 is determined at the potential $V_{data}$, the transistor M8 is turned off by controlling the potential of the signal WRITE. The node ND2 is brought into a floating state when the transistor M8 is turned off, the transistor M10 remain on and the potential $V_{data}$ at the node ND1 is retained. The potential $V_{data}$ is analog data that includes an analog voltage value. The memory circuit 12 can store analog data that includes an analog current value by converting the analog data that includes the analog current value to analog data that includes an analog voltage value, and retaining the voltage value at the node ND1 that is in a floating state.

Note that a transistor with low off-state current is preferably used as the transistor M8. In addition, a transistor with less gate leakage than the transistor M8, such as a transistor with a thicker gate insulating film than the transistor M8, is preferably used as the transistor M10.

In the memory circuit 12 illustrated in FIG. 3B, the potential at the node ND1 can be retained even when the gate leakage of the transistor M9 is larger than that of the transistor M7 in the memory circuit 12 illustrated in FIG. 3A.

To reduce the off-state current of a transistor, a channel formation region contains a semiconductor with a wide energy gap, for example. The energy gap of the semiconductor is preferably greater than or equal to 2.5 eV, greater than or equal to 2.7 eV, or greater than or equal to 3 eV. An oxide semiconductor can be given as an example of such a semiconductor material. A transistor containing an oxide semiconductor in a channel formation region may be used as the transistors M8 and M10. The leakage current of an OS transistor (a transistor containing an oxide semiconductor in a channel formation region) normalized by channel width can be lower than or equal to $10 \times 10^{-21}$ A/μm (10 zA/μm) with a source-drain voltage of 10 V at room temperature (approximately 25° C.). The leakage current of the OS transistor used as each of the transistors M8 and M10 is preferably lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$A at 85° C.

An oxide semiconductor is a semiconductor which has a large energy gap and in which electrons are unlikely to be excited and the effective mass of a hole is large. Accordingly, an avalanche breakdown and the like are less likely to occur in the OS transistor than in a generally-used transistor using silicon or the like. Since hot-carrier degradation or the like due to the avalanche breakdown is inhibited, the OS transistor has high drain breakdown voltage and can be driven at high drain voltage.

A channel formation region of the transistor is preferably formed using an oxide semiconductor containing at least one of indium (In) and zinc (Zn). Typical examples of such an oxide semiconductor include an In oxide, a Zn oxide, an In—Zn oxide, and an In-M-Zn oxide (element M is Al, Ti, Ga, Y, Zr, La, Ce, Nd, or Hf). A reduction in impurities serving as electron donors, such as hydrogen, and a reduction in oxygen vacancies can make an oxide semiconductor i-type (intrinsic) or substantially i-type. Such an oxide semiconductor can be referred to as a highly purified oxide semiconductor.

The channel formation region is preferably formed with an oxide semiconductor with a low carrier density. The carrier density of an oxide semiconductor is, for example, preferably less than $8 \times 10^{11}/cm^3$ and more than or equal to $1 \times 10^{-9}/cm^3$. The carrier density is preferably less than $1 \times 10^{11}/cm^3$, and further preferably less than $1 \times 10^{10}/cm^3$.

A highly purified intrinsic or substantially highly purified intrinsic oxide semiconductor has few carrier generation sources, and thus can have a low carrier density. The highly purified intrinsic or substantially highly purified intrinsic oxide has a low density of defect states and accordingly has a low density of trap states in some cases. A charge trapped by a trap state in the oxide semiconductor takes a long time to be released and may behave like a fixed charge. Thus, a transistor whose channel formation region is formed using an oxide semiconductor with a high density of trap states has unstable electrical characteristics in some cases.

Thus, in order to obtain stable electrical characteristics of the OS transistor, it is effective to reduce the concentration of impurities in the channel formation region. In addition, in order to reduce the concentration of impurities in the channel formation region, the concentration of impurities in a region in that is adjacent to the channel formation region is preferably low. Examples of impurities in an oxide semiconductor include hydrogen, nitrogen, carbon, silicon, alkali metal, and alkaline earth metal.

Figure 4A:
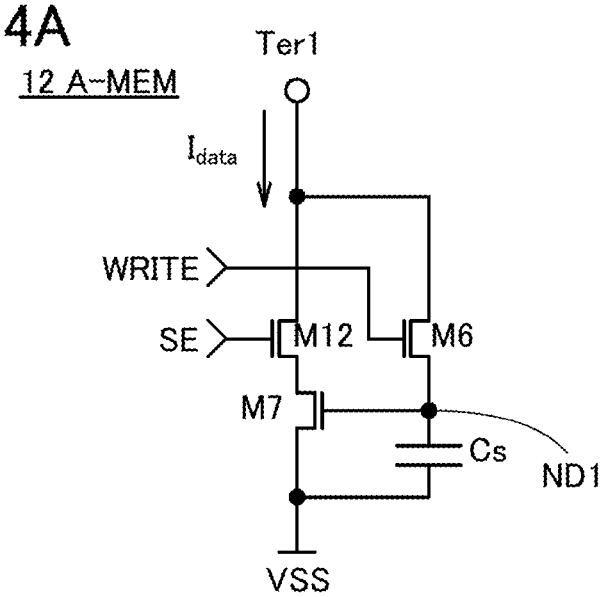
FIGS. 4A and 4B each illustrate a configuration of a memory circuit.

FIG. 4A illustrates a configuration of the memory circuit 12 where a transistor M12 is added to the memory circuit 12 illustrated in FIG. 3A. Specifically, a signal SE is input to a gate of the transistor M12. The transistor M12 is connected in series between the one of the source and the drain of the transistor M6 and the one of the source and the drain of the transistor M7. Specifically, one of a source and a drain of the transistor M12 is electrically connected to the one of the source and the drain of the transistor M6, and the other of the source and the drain of the transistor M12 is electrically connected to the one of the source and the drain of the transistor M7. The current $I_{data}$ from the converter circuit 11 is supplied through the terminal Ter1 to the one of the source and the drain of each of the transistors M6 and M12.

When the current $I_{data}$ is written into the memory circuit 12, the transistor M6 is turned on by controlling the potential of the signal WRITE, and the transistor M12 is turned on by controlling the potential of the signal SE. When both the transistors M6 and M12 are on, the one of the source and the drain of the transistor M7 and the gate of the transistor M7 are electrically connected to each other. In this state, the potential $V_{data}$ can be written to the node ND1 through an operation similar to that illustrated in FIG. 3A, by writing the current $I_{data}$ into the memory circuit 12.

After the potential at the node ND1 is determined at the potential $V_{data}$, the transistor M6 is turned off by controlling the potential of the signal WRITE, so as to retain the potential $V_{data}$ at the node ND1. At this time, the transistor M12 may be kept on; however, the transistor M12 can be turned off by controlling the potential of the signal SE, thus reducing the power consumption of the memory circuit 12.

Figure 4B:
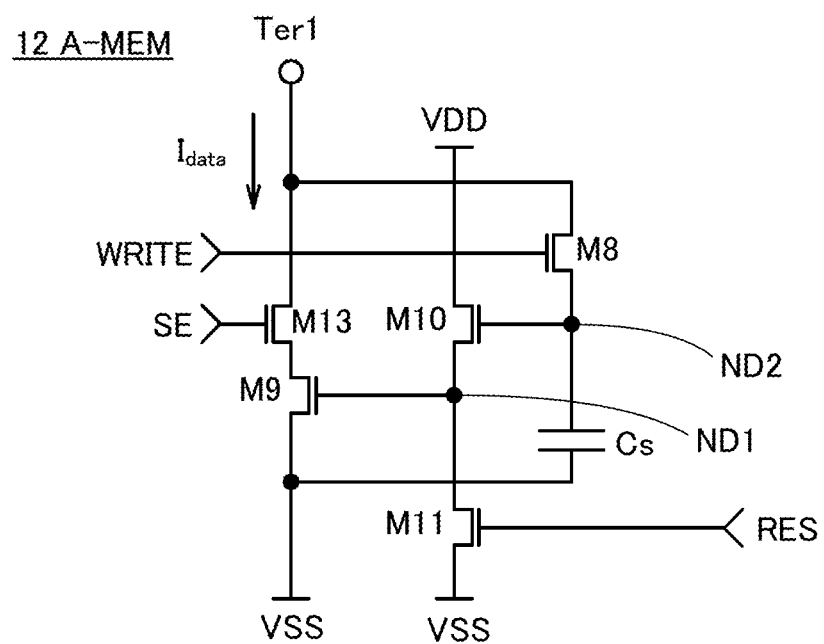

FIG. 4B illustrates a configuration of the memory circuit 12 where a transistor M13 is added to the memory circuit 12 illustrated in FIG. 3B. Specifically, a signal SE is input to a gate of the transistor M13. The transistor M13 is connected in series between one of a source and a drain of the transistor M8 and one of a source and a drain of the transistor M9. Specifically, one of a source and a drain of the transistor M13 is electrically connected to one of a source and a drain of the transistor M8, and the other of the source and the drain of the transistor M13 is electrically connected to one of a source and a drain of the transistor M9. The current $I_{data}$ from the converter circuit 11 is supplied through the terminal Ter1 to one of a source and a drain of each of the transistors M8 and M13.

When the current $I_{data}$ is written into the memory circuit 12, the transistor M8 is turned on by controlling the potential of the signal WRITE, and the transistor M13 is turned on by controlling the potential of the signal SE. When both the transistors M8 and M13 are on, the potential $V_{data}$ can be written at the node ND1 through an operation similar to that illustrated in FIG. 3B, by writing the current $I_{data}$ into the memory circuit 12.

After the potential at the node ND1 is determined at the potential $V_{data}$, the transistor M8 is turned off by controlling the potential of the signal WRITE, so as to retain the potential $V_{data}$ at the node ND1. At this time, the transistor M13 may be kept on; however, the transistor M13 can be turned off by controlling the potential of the signal SE, thus reducing the power consumption of the memory circuit 12.

Figure 2:
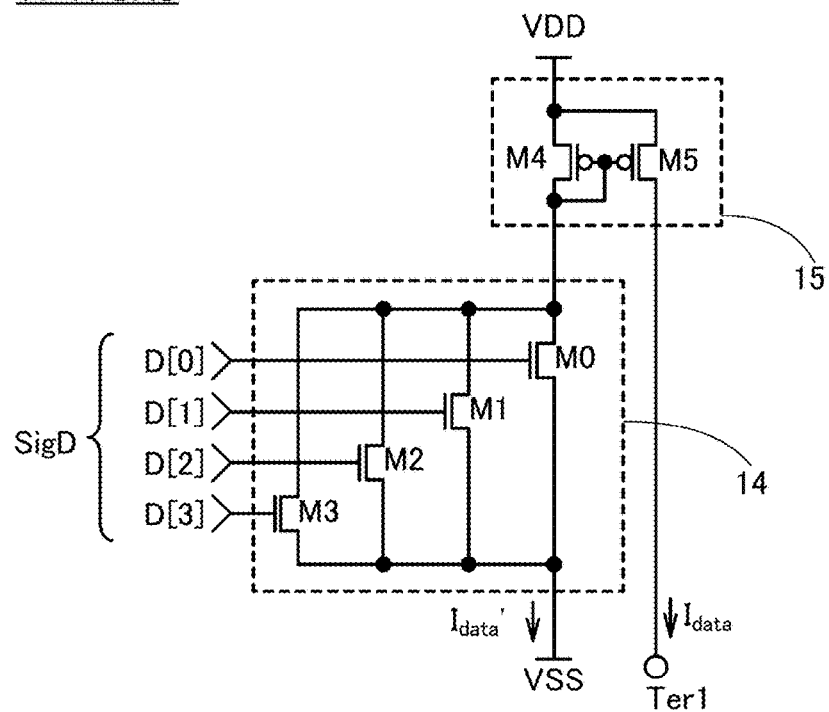
FIG. 2 illustrates a configuration of a converter circuit.

Note that when the converter circuit 11 illustrated in FIG. 2 and the memory circuit 12 illustrated in FIGS. 3A, 3B, 4A or 4B are included in the data comparison circuit 10 illustrated in FIG. 1, it is preferable that the following transistors have substantially the same value of the drain current normalized by channel width versus the gate voltage: the transistors M0 to M5 illustrated in FIG. 2 and the transistor M7 illustrated in FIG. 3A, the transistor M9 illustrated in FIG. 3B, the transistors M7 and M12 illustrated in FIG. 4A, or the transistors M9 and M13 illustrated in FIG. 4B. Accordingly, the transistors M0 to M5 and the transistors M7, M9, M12 and M13 preferably include the same semiconductor material. Silicon can be used in all of the transistors M0 to M5 and the transistors M7, M9, M12 and M13. In addition, an existing fabrication process can be used to fabricate the transistors M4 and M5, which are p-channel transistors, the transistors M0 to M3, which are n-channel transistors, and the transistors M7, M9, M12 and M13, which are n-channel transistors. Thus, it can be said that silicon is a suitable material for all of the transistors M0 to M5 and the transistors M7, M9, M12 and M13. Furthermore, fabricating all of the transistors M0 to M5 and the transistors M7, M9, M12 and M13 with silicon that has crystallinity can reduce the area of the converter circuit 11 and the memory circuit 12.

Furthermore, a gate insulating film of the OS transistor can be formed thickly, even when the transistor is downsized. Thus, a use of the transistor with an oxide semiconductor in the transistors M8 and M10 of the memory circuit 12 illustrated in FIG. 3B or FIG. 4B can prevent the potential at the node ND2 from being changed by the gate leakage through the gate insulating film, even when the transistors M8 and M10 are downsized. Therefore, the potential at the node ND1 can be prevented from decreasing due to the gate leakage that is caused by the thinning of the gate insulating film in the transistors M9 and M13, even when silicon is used for the transistors M9 and M13, and when the transistors M9 and M13 are downsized to 60 nm technology, for example.

Figure 5:
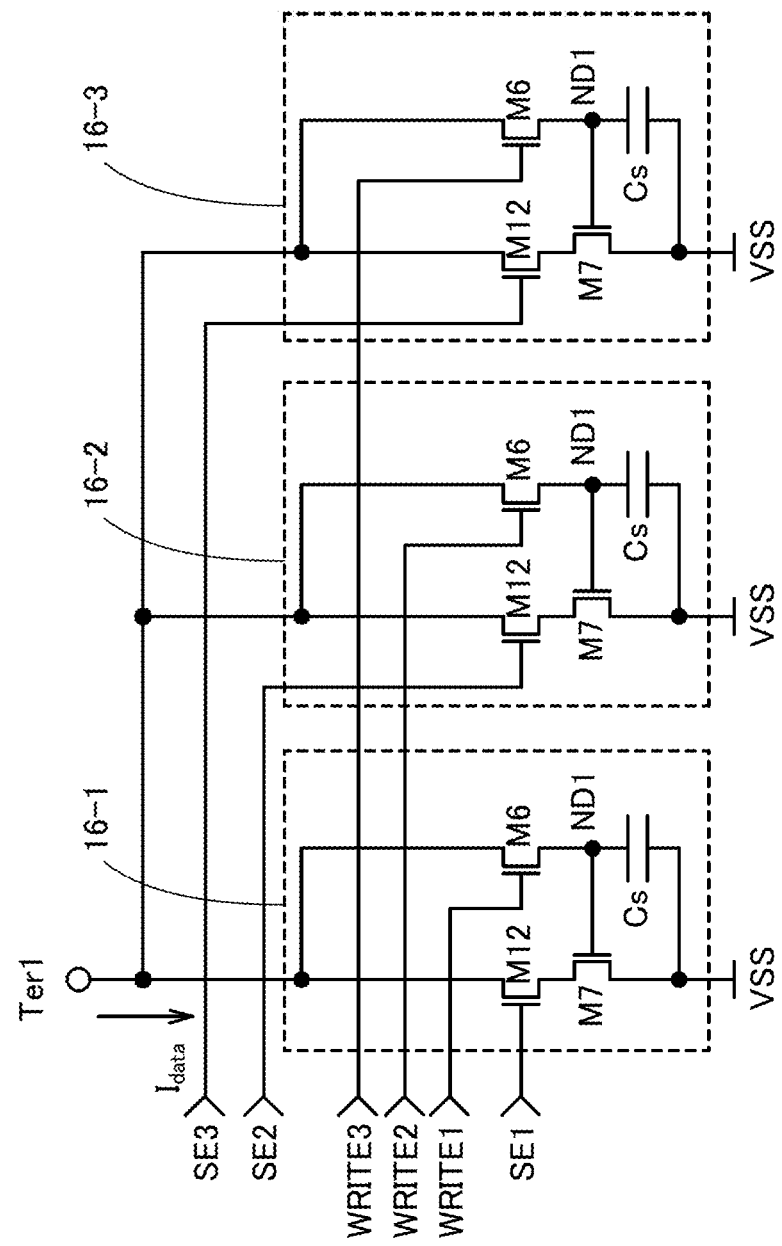
FIG. 5 illustrates a configuration of a memory circuit.

Next, FIG. 5 illustrates a configuration example of the memory circuit 12 that has a function of storing a plurality of analog data. FIG. 5 illustrates a configuration example of the memory circuit 12 which includes three memory circuits 16, which are illustrated as memory cells 16-1 to 16-3. Each of the memory cells 16-1 to 16-3 illustrated in FIG. 5 has the same configuration as the memory circuit 12 illustrated in FIG. 4A.

In the memory circuit 12 illustrated in FIG. 5, one of a source and a drain of the transistor M6 that is included in each of the memory cells 16-1 to 16-3 is electrically connected to each other. In addition, one of a source and a drain of the transistor M12 that is included in each of the memory cells 16-1 to 16-3 is electrically connected to each other.

The signals WRITE from different systems are input to the gates of the transistors M6 included in the memory cells 16-1 to 16-3. In FIG. 5, the signal WRITE that is input to the gate of the transistor M6 included in the memory cell 16-1 is illustrated as a signal WRITE1. The signal WRITE that is input to the gate of the transistor M6 included in the memory cell 16-2 is illustrated as a signal WRITE2. The signal WRITE that is input to the gate of the transistor M6 included in the memory cell 16-3 is illustrated as a signal WRITE3.

The signals SE from different systems are input to the gate of the transistor M12 included in each of the memory cells 16-1 to 16-3. In FIG. 5, the signal SE that is input to the gate of the transistor M12 included in the memory cell 16-1 is illustrated as a signal SE1. The signal SE that is input to the gate of the transistor M12 included in the memory cell 16-2 is illustrated as a signal SE2. The signal SE that is input to the gate of the transistor M12 included in the memory cell 16-3 is illustrated as a signal SE3.

The current $I_{data}$ is input through the terminal Ter1 to each of the memory cells 16-1 to 16-3. For example, when the current value of the current $I_{data}$ is stored in only the memory cell 16-1 among the memory cells 16-1 to 16-3, the potentials of the signals SE1 to SE3 and the signals WRITE1 to WRITE3 are controlled to turn on the transistors M6 and M12 included in the memory cell 16-1, and to turn off the transistors M6 and M12 included in each of the memory cells 16-2 and 16-3. In this state, the current value of the current $I_{data}$ can be written into only the memory cell 16-1 by inputting the current $I_{data}$ to the node ND1 of the memory cell 16-1. Then, the analog data can be retained in the memory cell 16-1 by controlling the potentials of the signals SE1 and WRITE1 to turn off the transistors M6 and M12 included in the memory cell 16-1, bringing the node ND1 into a floating state.

When the current value of the current $I_{data}$ stored in the memory cell 16-1 is read, the potentials of the signals SE1 to SE3 and the signals WRITE1 to WRITE3 may be controlled to turn on the transistor M12 included in the memory cell 16-1, to keep the transistor M12 included in each of the memory cells 16-2 and 16-3 off, and to keep the transistor M6 included in each of the memory cells 16-1 to 16-3 off.

Figure 6:
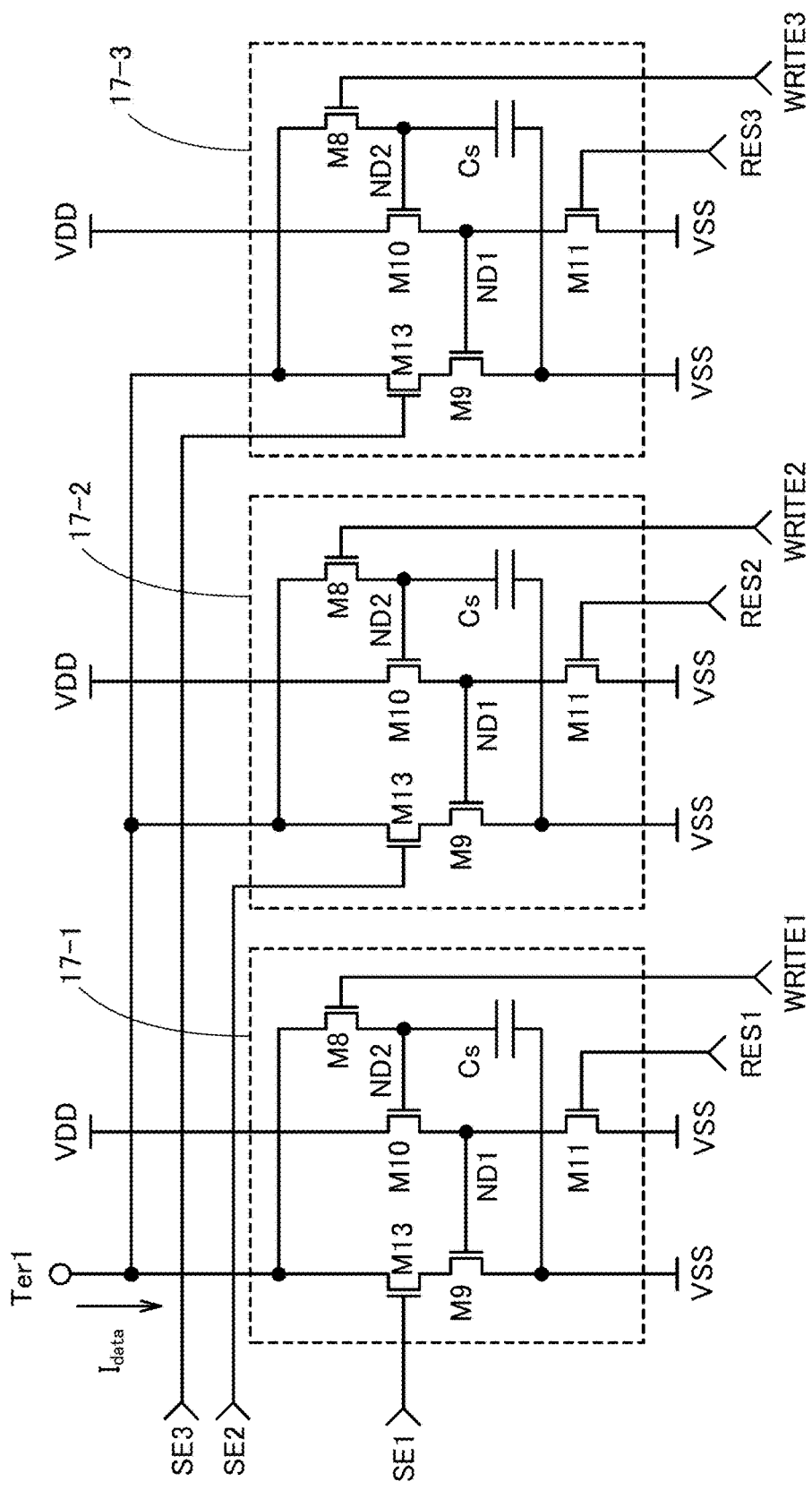
FIG. 6 illustrates a configuration of a memory circuit.

Next, FIG. 6 illustrates another configuration example of the memory circuit 12 that has a function of storing a plurality of analog data. FIG. 6 illustrates a configuration example of the memory circuit 12 which includes three memory cells 17, which are illustrated as memory cells 17-1 to 17-3. Each of the memory cells 17-1 to 17-3 illustrated in FIG. 6 has the same configuration as the memory circuit 12 illustrated in FIG. 4B.

In the memory circuit 12 illustrated in FIG. 6, one of a source and a drain of the transistor M8 that is included in each of the memory cells 17-1 to 17-3 is electrically connected to each other. In addition, one of a source and a drain of the transistor M13 that is included in each of the memory cells 17-1 to 17-3 is electrically connected to each other.

The signals WRITE from different systems are input to the gate of the transistor M8 included in each of the memory cells 17-1 to 17-3. In FIG. 6, the signal WRITE that is input to the gate of the transistor M8 included in the memory cell 17-1 is illustrated as the signal WRITE1. The signal WRITE that is input to the gate of the transistor M8 included in the memory cell 17-2 is illustrated as the signal WRITE2. The signal WRITE that is input to the gate of the transistor M8 included in the memory cell 17-3 is illustrated as the signal WRITE3.

The signals SE from different systems are input to the gate of the transistor M13 included in each of the memory cells 17-1 to 17-3. In FIG. 6, the signal SE that is input to the gate of the transistor M13 included in the memory cell 17-1 is illustrated as the signal SE1. The signal SE that is input to the gate of the transistor M13 included in the memory cell 17-2 is illustrated as the signal SE2. The signal SE that is input to the gate of the transistor M13 included in the memory cell 17-3 is illustrated as the signal SE3.

The current $I_{data}$ is input through the terminal Ter1 to each of the memory cells 17-1 to 17-3. For example, when the current value of the current $I_{data}$ is stored in only the memory cell 17-1 among the memory cells 17-1 to 17-3, the potential of the signals SE1 to SE3 and the signals WRITE1 to WRITE3 are controlled to achieve the following effect: turning on the transistors M8 and M13 included in the memory cell 17-1, and turning off the transistors M8 and M13 included in each of the memory cells 17-2 and 17-3. In this state, the current value of the current $I_{data}$ can be written into only the memory cell 17-1 by inputting the current $I_{data}$ to the node ND2 of the memory cell 17-1. Then, the analog data can be retained at the memory cell 17-1 by controlling the potential of the signals SE1 and WRITE1 to turn off the transistors M8 and M13 included in the memory cell 17-1, bringing the node ND2 into a floating state.

When the current value of the current $I_{data}$ stored in the memory cell 17-1 is read, the potential of the signals SE1 to SE3 and the signals WRITE1 to WRITE3 may be controlled to achieve the following effect: turning on the transistor M13 included in the memory cell 17-1, keeping the transistor M13 included in each of the memory cells 17-2 and 17-3 off, and keeping the transistor M8 included in each of the memory cells 17-1 to 17-3 off.

Next, a specific configuration example of the detection circuit 13 is described.

Figure 7:
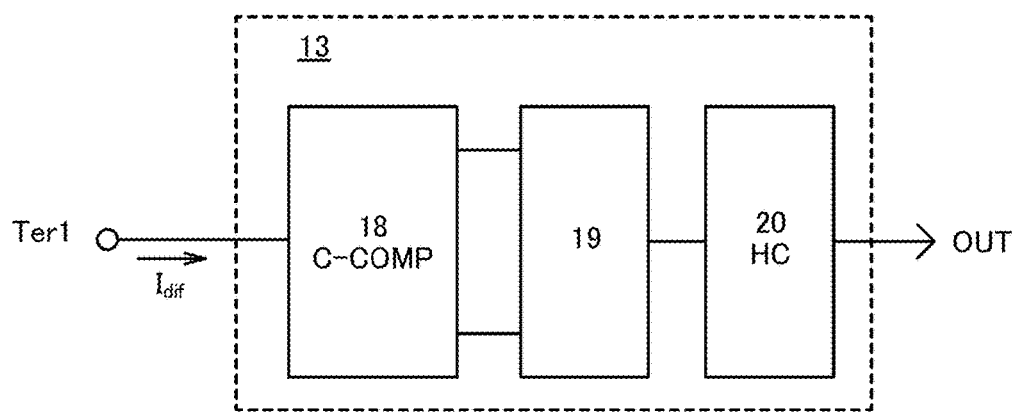
FIG. 7 illustrates a configuration of a detection circuit.

The detection circuit 13 illustrated in FIG. 7 includes a current comparison circuit 18 (C-COMP), a determination circuit 19, and a retention circuit 20 (HC). The current comparison circuit 18 has a function of comparing the current value of the current $I_{data}1$ (stored in the memory circuit 12) and the current value of the current $I_{data}2$ (obtained in the converter circuit 11), using the current value of the current $I_{dif}$ that is input through the terminal Ter1.

Specifically, the detection circuit 13 has a function of generating data that contains information indicating the relation between the currents $I_{data}1$ and $I_{data}2$, from the current value of the current $I_{dif}$. The data indicate whether the current value of the current $I_{data}1$ is equal to, greater than, or less than the current value of the current $I_{data}2$. Alternatively, the detection circuit 13 has a function of generating data that contains information indicating which of the currents $I_{data}1$ and $I_{data}2$ has a greater current value, and how much greater the current value is.

The determination circuit 19 has a function of performing signal processing on a signal that contains the results of comparison in the detection circuit 13, and outputting the processed signal. The function of the determination circuit 19 varies depending on the type of information that is to be contained within the signal output from the data comparison circuit 10. For example, the determination circuit 19 can generate a digital signal that contains information that indicates whether the current value of the $I_{data}1$ matches the current value of the $I_{data}2$, from the digital data output from the detection circuit 13. Alternatively, the determination circuit 19 can generate a digital or analog signal that contains information indicating the difference between the current values of the currents $I_{data}1$ and $I_{data}2$.

The retention circuit 20 has a function of retaining a signal that is output from the determination circuit 19. Note that the detection circuit 13 can be configured without the retention circuit 20.

Figure 8:
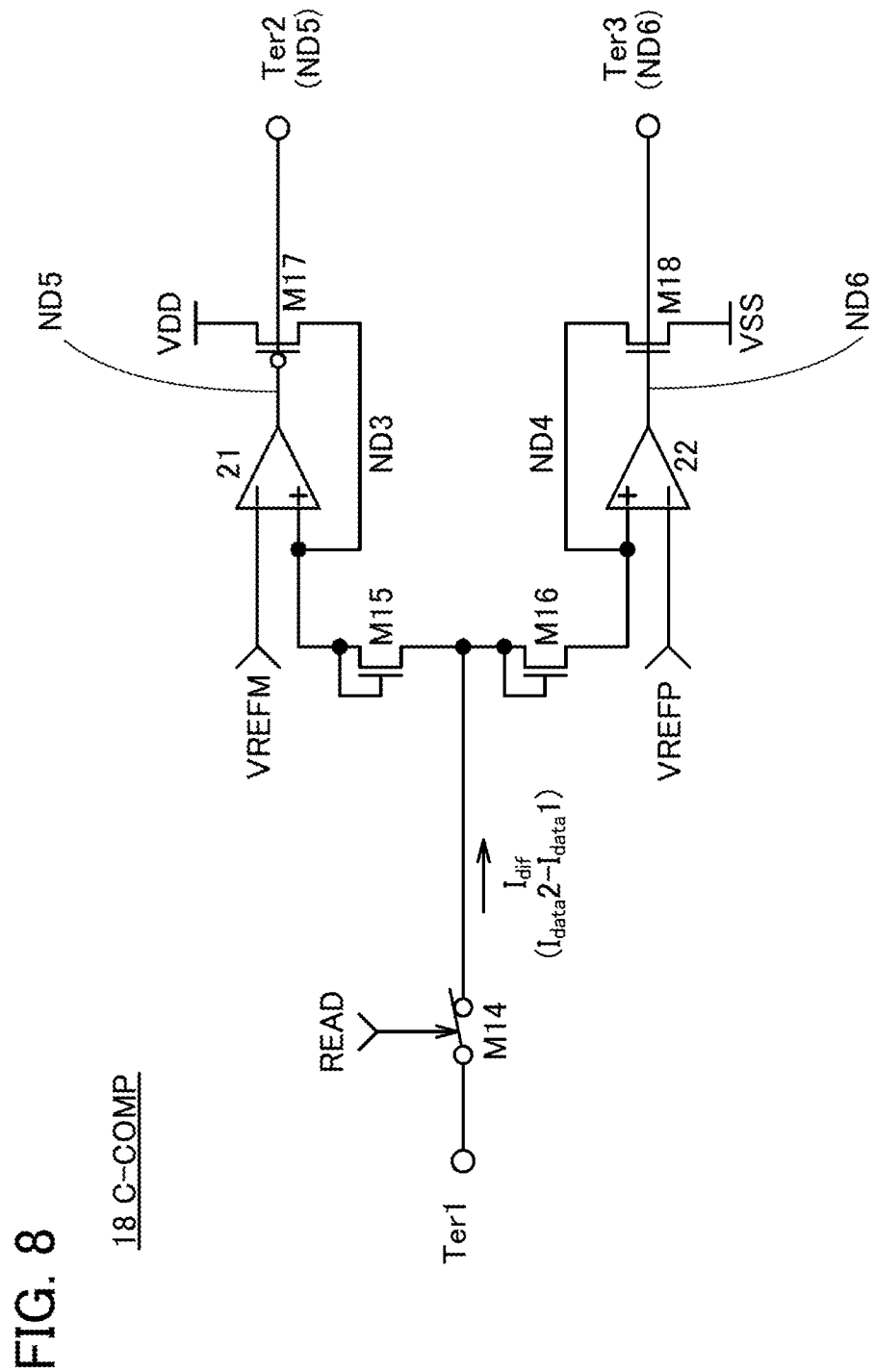
FIG. 8 illustrates a configuration of a current comparison circuit.

FIG. 8 illustrates a specific configuration example of the current comparison circuit 18. The current comparison circuit 18 illustrated in FIG. 8 includes a switch M14, a transistor M15, a transistor M16, a comparator 21, a comparator 22, a transistor M17, and a transistor M18. Note that FIG. 8 illustrates an example where the transistors M15, M16 and M18 are n-channel transistors, and the transistor M17 is a p-channel transistor.

The switch M14 has a function of controlling the input to the transistors M15 and M16 through the terminal Ter1 of the current $I_{dif}$, in accordance with the potential of a signal READ.

One of a source and a drain of the transistor M15 is electrically connected to one of a source and a drain of the transistor M16. The other of the source and the drain of the transistor M15 is electrically connected to a non-inverting input terminal (+) of the comparator 21. The other of the source and the drain of the transistor M16 is electrically connected to a non-inverting input terminal (+) of the comparator 22. An inverting input terminal (−) of the comparator 21 is electrically connected to a node (wiring) that is supplied with a reference potential VREFM. An inverting input terminal (−) of the comparator 22 is electrically connected to a node (wiring) that is supplied with a reference potential VREFP.

An output terminal of the comparator 21 is electrically connected to a gate of the transistor M17 and a terminal Ter2. An output terminal of the comparator 22 is electrically connected to a gate of the transistor M18 and a terminal Ter3. One of a source and a drain of the transistor M17 is electrically connected to the node (wiring) that is supplied with the power supply voltage VDD. The other of the source and the drain of the transistor M17 is electrically connected to the non-inverting input terminal (+) of the comparator 21. One of a source and a drain of the transistor M18 is electrically connected to the node (wiring) that is supplied with the power supply voltage VSS. The other of the source and the drain of the transistor M18 is electrically connected to the non-inverting input terminal (+) of the comparator 22.

When the switch M14 is turned on in accordance with the potential of the signal READ, the current $I_{dif}$ is input to the current comparison circuit 18 through the terminal Ter1. The relationship between the current values of the currents $I_{dif}$, $I_{data}1$ and $I_{data}2$ is expressed as $I_{dif}=I_{data}2-I_{data}1$. When $I_{data}1>I_{data}2$, $I_{dif}<0$. When $I_{data}1<I_{data}2$, $I_{dif}>0$. When $I_{data}1=I_{data}2$, $I_{dif}=0$.

When $I_{dif}<0$, the transistor M15 is turned on, and the transistor M16 is turned off. When the non-inverting input terminal (+) of the comparator 21 is designated as a node ND3, turning on the transistor M15 causes the potential at the node ND3 to gradually decrease. When the potential at the node ND3 decreases to a level lower than the potential VREFM, the potential at the output terminal of the comparator 21 is set at a low level, and the low-level potential is supplied to the terminal Ter2.

When the output terminal of the comparator 21 is designated as a node ND5, setting the potential at the node ND5 at a low level turns on the transistor M17. When the transistor M17 is turned on, the power supply voltage VDD is supplied through the transistor M17 to the non-inverting input terminal (+) of the comparator 21; thus, the potential at the node ND3 gradually increases. When the potential at the node ND3 increases to a level higher than the potential VREFM, the potential at the output terminal of the comparator 21 is set at a high level, and the high-level potential is supplied to the terminal Ter2.

Thus, when $I_{dif}<0$, the potential at the terminal Ter2 changes so as to oscillate between high and low levels at certain intervals. The oscillation frequency of the potential at the terminal Ter2 (i.e., the node ND5) becomes higher as the $I_{dif}$ becomes smaller.

At this time, the transistor M16 is off. Thus the potential at the output terminal of the comparator 22 is not oscillating, and the comparator 22 is in a steady state. Here, the non-inverting input terminal (+) of the comparator 22 is designated as a node ND4 and the output terminal of the comparator 22 is designated as a node ND6. When the comparator 22 is in a steady state, the potential at the node ND4 is set to be slightly lower than the potential VREFP, a low-level potential is supplied to the node ND6, and the transistor M18 retains its off state. Thus, when $I_{dif}<0$, the terminal Ter3 is supplied with the low-level potential.

When $I_{dif}>0$, the transistor M16 is turned on, and the transistor M15 is turned off. Turning on the transistor M16 causes the potential at the node ND4, which is the non-inverting input terminal (+) of the comparator 22, to gradually increase. When the potential of the node ND4 increases to a level higher than the potential VREFP, the potential at the output terminal of the comparator 22 is set at a high level, and the high-level potential is supplied to the terminal Ter3.

Then, when the potential at the node ND6, which is the output terminal of the comparator 22, is set at a high level, the transistor M18 is turned on. When the transistor M18 is turned on, the power supply voltage VSS is supplied through the transistor M18 to the non-inverting input terminal (+) of the comparator 21; thus, the potential at the node ND4 gradually decreases. When the potential at the node ND4 decreases to a level lower than the potential VREFP, the potential at the output terminal of the comparator 22 is set at a low level, and the low-level potential is supplied to the terminal Ter3.

Thus, when $I_{dif}>0$, the potential at the terminal Ter3 changes so as to oscillate between high and low levels at certain intervals. The oscillation frequency of the potential at the terminal Ter3 (i.e., the node ND6) becomes larger as the $I_{dif}$ becomes larger.

At this time, the transistor M15 is off. Thus the potential at the output terminal of the comparator 21 is not oscillating, and the comparator 21 is in a steady state. When the comparator 21 is in a steady state, the potential at the node ND3 (the non-inverting input terminal (+) of the comparator 21) is set to be slightly higher than the potential VREFM, the node ND5 (the output terminal of the comparator 21) is supplied with a high-level potential, and the transistor M17 retains its off state. Thus, when $I_{dif}>0$, the terminal Ter2 is supplied with the high-level potential.

When $I_{dif}=0$, the comparators 21 and 22 are both in a steady state. Thus, the terminal Ter2 is supplied with a high-level potential, and the terminal Ter3 is supplied with a low-level potential. Alternatively, the potential at one of the output terminals may change with a significantly low oscillation frequency, when compared with cases where $I_{dif}<0$ or $I_{dif}>0$.

Next, a configuration example of the determination circuit 19 and the retention circuit 20 is described with reference to FIG. 9.

Figure 9:
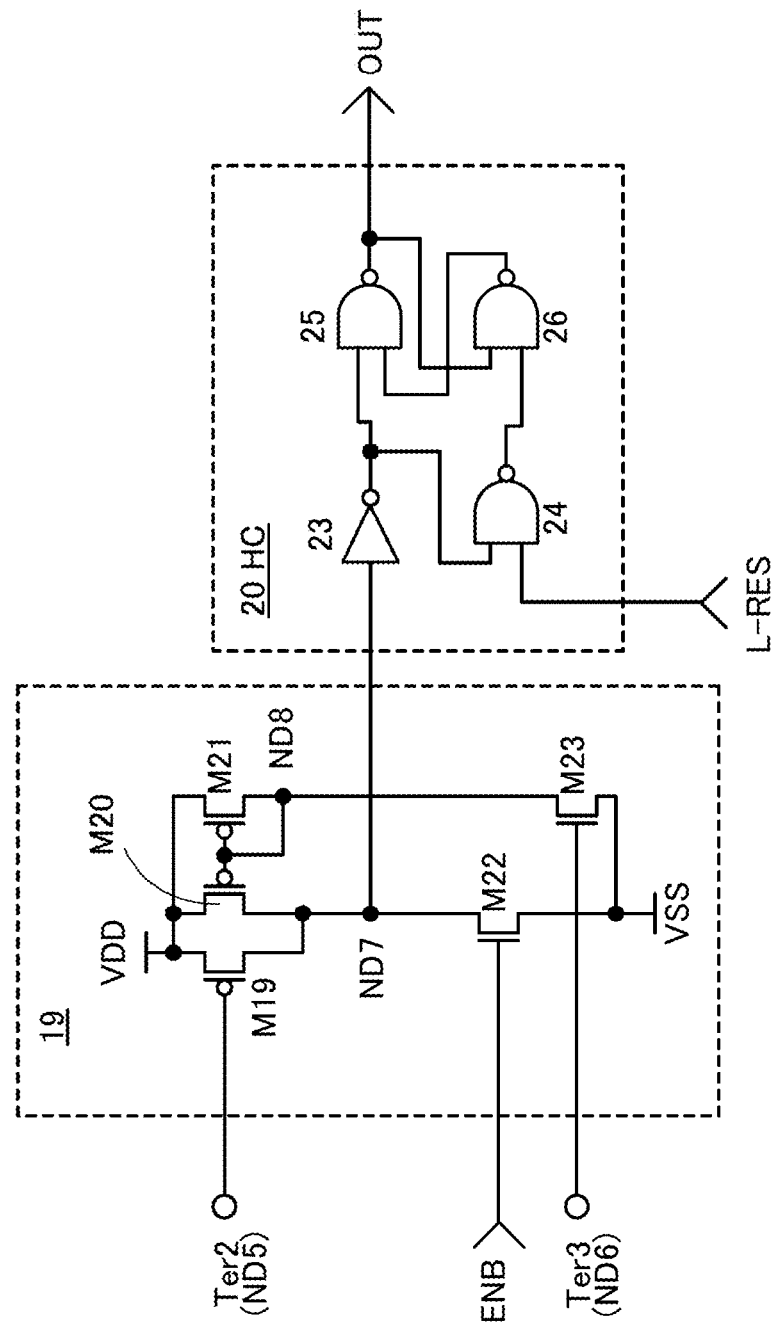
FIG. 9 illustrates a configuration of a determination circuit and a retention circuit.

The determination circuit 19 illustrated FIG. 9 includes transistors M19 to M23. FIG. 9 illustrates a case where the transistors M19 to M21 are p-channel transistors, and the transistors M22 and M23 are n-channel transistors.

A signal is input to a gate of the transistor M19 through the terminal Ter2, from the current comparison circuit 18. One of a source and a drain of each of the transistors M19 to M21 is electrically connected to the node (wiring) that is supplied with the power supply voltage VDD. One of a source and a drain of each of the transistors M22 and M23 is electrically connected to the node (wiring) that is supplied with the power supply voltage VSS. A signal ENB is supplied to a gate of the transistor M22. A signal is input to a gate of the transistor M23 through the terminal Ter3, from the current comparison circuit 18. The other of the source and the drain of each of the transistors M19 and M20 is electrically connected to the other of the source and the drain of the transistor M22. The gates of transistors M20 and M21 and the other of the source and the drain of the transistor M21 are all electrically connected to the other of the source and the drain of the transistor M23.

The retention circuit 20 illustrated in FIG. 9 includes an inverter 23 and NANDs 24 to 26. An input terminal of the inverter 23 is electrically connected to the other of the source and the drain of each of the transistors M19 and M20, and the other of the source and the drain of the transistor M22. The output terminal of the inverter 23 is electrically connected to a first input terminal of the NAND 24 and a first input terminal of the NAND 25. A signal L-RES is input to a second input terminal of the NAND 24. An output terminal of the NAND 24 is electrically connected to a second input terminal of the NAND 26. An output terminal of the NAND 25 is electrically connected to a first input terminal of the NAND 26. An output terminal of the NAND 26 is electrically connected to a second input terminal of the NAND 25. The output terminal of the NAND 25 is connected to an output terminal OUT.

In the determination circuit 19 illustrated in FIG. 9, when $I_{dif}<0$, the potential at the terminal Ter2 is oscillating, the potential at the terminal Ter3 is set at a low level, and the transistor M22 is turned off in accordance with the potential ENB, supplying a low-level potential from the terminal Ter2 to the gate of the transistor M19 turns on the transistor M19. Accordingly, the power supply voltage VDD is supplied to a node ND7 through the transistor M19. Then, setting the potential at the terminal Ter2 at a high level turns off the transistor M19, but the node ND7 retains the high-level potential. The transistor M23 is off because the low-level potential is supplied from the terminal Ter3 to its gate.

In the determination circuit 19 illustrated in FIG. 9, when $I_{dif}>0$, the potential at the terminal Ter2 is set at a high level, the potential at the terminal Ter3 is oscillating, and the transistor M22 is turned off in accordance with the potential ENB, supplying a high-level potential from the terminal Ter3 to the gate of the transistor M23 turns on the transistor M23. When the other of the source and the drain of the transistor M21 is designated as a node ND8, a potential at the node ND8 gradually decreases because the power supply voltage VSS is supplied to the node ND8 through the transistor M23. Reduction of the potential at the node ND8 turns the transistors M20 and M21 on, supplying the power supply voltage VDD to the node ND7. Then, setting the potential at the terminal Ter3 at a low level turns off the transistor M23, but the node ND7 retains the high-level potential. The transistor M19 is off because a high-level potential is supplied from the terminal Ter2 to its gate.

Note that turning on the transistor M22 by controlling the potential ENB can supply the power supply voltage VSS through the transistor M22 to the node ND7, which can reset the potential at the node ND7.

In the determination circuit 19 illustrated in FIG. 9, when the potential at the node ND7 is reset at a low level, $I_{dif}=0$, the potential at the terminal Ter2 is set at a high level, the potential at the terminal Ter3 is set at a low level, and the transistor M22 is turned off in accordance with the potential ENB, then the transistors M19 and M23 are off, and the node ND7 retains the low-level potential.

In the retention circuit 20 illustrated in FIG. 9, the potential at the input terminal of the inverter 23 is set at a high level when $I_{dif}<0$ or $I_{dif}>0$. In this state, the potential at the output terminal OUT is retained at a high level. In addition, in the retention circuit 20 illustrated in FIG. 9, the potential at the input terminal of the inverter 23 is set at a low level when $I_{dif}=0$. When the signal L-RES is set at a high level in this state, the potential at the output terminal OUT is retained at a low level. In other words, in the retention circuit 20 illustrated in FIG. 9, setting the potential at the input terminal of the inverter 23 at the low level and the potential of the signal L-RES at the high level can reset the potential at the output terminal OUT to the low level.

Next, an example of the operation of the data comparison circuit 10 is described with reference to the timing chart illustrated in FIG. 10. Note that FIG. 10 illustrates a timing chart of the data comparison circuit 10 including the converter circuit 11 illustrated in FIG. 2, the memory circuit 12 illustrated in FIG. 4A, the current comparison circuit 18 illustrated in FIG. 8, and the determination circuit 19 and the retention circuit 20, both of which are illustrated in FIG. 9.

Figure 10:
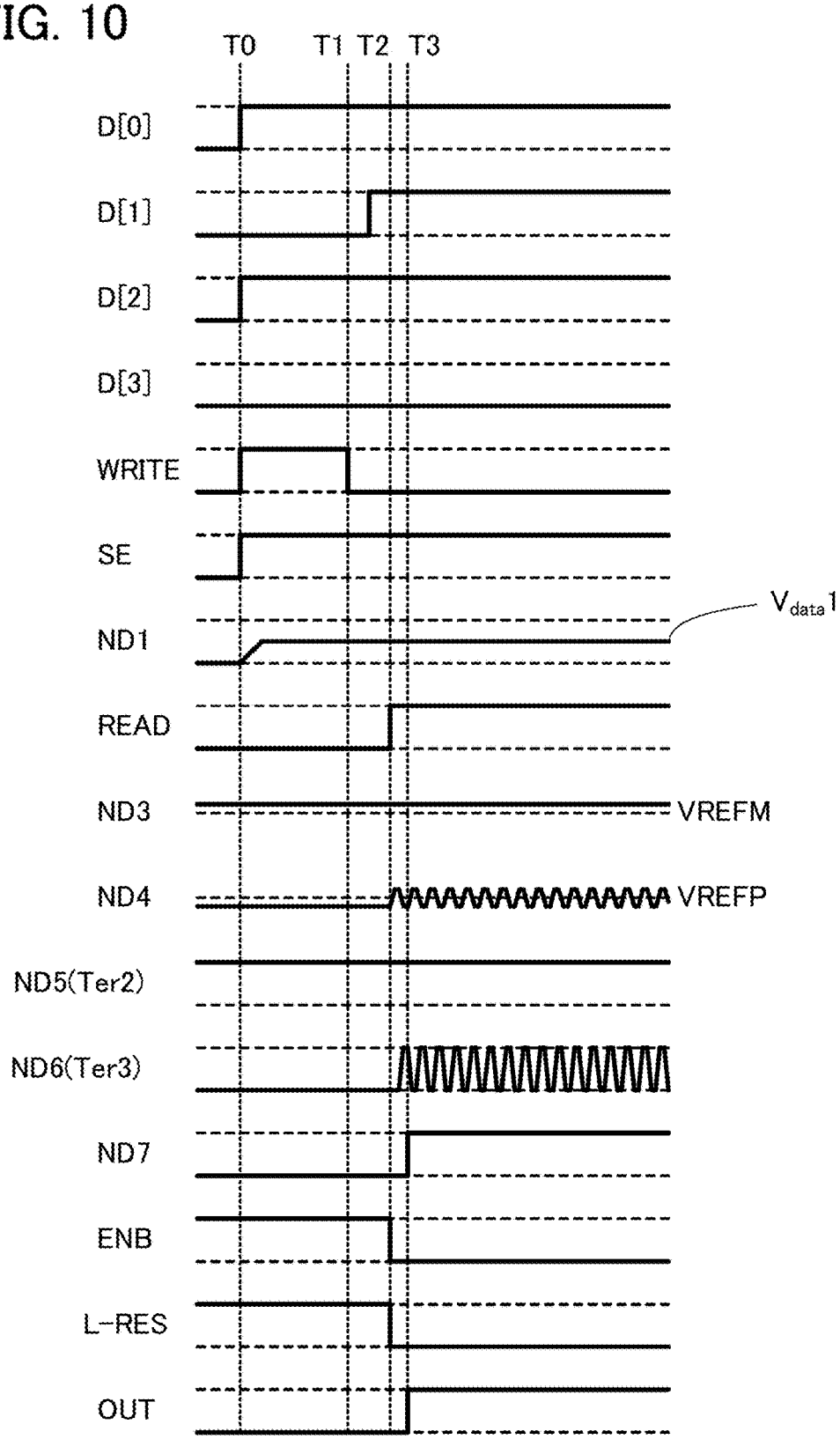
FIG. 10 is a timing chart.

Note that FIG. 10 illustrates a timing chart in the case where the current value of the current $I_{data}1$ that corresponds to digital data of D[0]=1, D[1]=0, D[2]=1, and D[3]=0 is stored in the memory circuit 12, and where the current $I_{data}2$ that is obtained in the converter circuit 11 and is a subject of comparison corresponds to digital data of D[0]=1, D[1]=1, D[2]=1, and D[3]=0.

At time T0, the potential of the signal ENB that is input to the determination circuit 19 illustrated in FIG. 9 is set at a high level, the potential at the node ND7 of the determination circuit 19 is reset to a low level. At time T0, the signal L-RES that is input to the retention circuit 20 illustrated in FIG. 9 is set at a high level, and the potential at the node ND7 is set at a low level. Thus, the potential at the output terminal OUT of the retention circuit 20 is reset to a low level.

At time T0, writing of analog data to the memory circuit 12 illustrated in FIG. 4A starts. Specifically, the potential of the signal WRITE changes from a low level to a high level, and the potential of the signal SE changes from a low level to a high level. Thus, the transistors M6 and M12 are turned on, and a potential $V_{data}1$ that corresponds to the current $I_{data}1$ is supplied to the node ND1.

Next, at time T1, writing of analog data to the memory circuit 12 illustrated in FIG. 4A is terminated, and the analog data is retained. Specifically, the potential of the signal WRITE changes to the low level, turning off the transistor M6. This brings the node ND1 into a floating state, thus retaining the potential $V_{data}1$.

After the transistor M6 is turned off, in a period from time T1 to time T2, the digital data of the signal SigD that is input to the converter circuit 11 illustrated in FIG. 2 become the following values: D[0]=1, D[1]=1, D[2]=1, and D[3]=0. The converter circuit 11 starts the output of the current $I_{data}2$, which corresponds to the digital data described above.

Next, at time T2, the signal L-RES that is input to the retention circuit 20 illustrated in FIG. 9 changes from a high level to a low level, and the potential at the output terminal OUT of the retention circuit 20 enters a state where the potential depends on the potential at the node ND7 (the input terminal of the inverter 23). Furthermore, the potential of the signal ENB that is input to the determination circuit 19 illustrated in FIG. 9 changes from a high level to a low level. The potential at the node ND7 of the determination circuit 19 enters a state where the potential is set depending on the potential at the nodes ND5 and ND6.

Then, at time T2, the potential of the signal READ that is input to the current comparison circuit 18 illustrated in FIG. 8 changes from a low level to a high level. Assuming that the switch M14 illustrated in FIG. 8 is turned off when the signal READ is set at a low level and is turned on when the level of the signal READ is high, the switch M14 is turned on when the potential of the signal READ changes from the low level to the high level. Then, the current $I_{dif}$ that corresponds to the difference between the currents $I_{data}1$ and $I_{data}2$ is input through the switch M14 to the current comparison circuit 18.

Note that FIG. 10 illustrates a timing chart of the case where the current $I_{data}1$<current $I_{data}2$, and the current $I_{dif}>0$.

When the current $I_{dif}$ is input to the current comparison circuit 18, the potential at the node ND6 (the output terminal of the comparator 22) oscillates; the potential at the node ND4 also oscillates correspondingly. At this time, the comparator 21 is in a steady state, and the node ND3 (the non-inverting input terminal (+) of the comparator 21) retains a potential that is slightly higher than the potential VREFM, and the node ND5 (the output terminal of the comparator 21) retains a high-level potential.

Then, the oscillation of the potential at the node ND6 and the retention of the high-level potential at the node ND5 cause the potential at the node ND7 in the determination circuit 19 illustrated in FIG. 9 to change from a low level to a high level, at time T3. When the potential at the node ND7 is set to the high level, the potential at the output terminal OUT of the retention circuit 20 changes from a low level to a high level. As the potential of the signal L-RES is set at the low level, the potential of the output terminal OUT is retained at a high level.

In one embodiment of the present invention, two digital data that are each made up of multiple bits and have been converted to analog data that each include an analog current value can be compared with each other through the operations described above. When digital data are directly compared, whether the data match needed to be determined on a per bit basis. In one embodiment of the present invention, the configuration described above eliminates the necessity to compare data on a per bit basis.

Figure 26A:
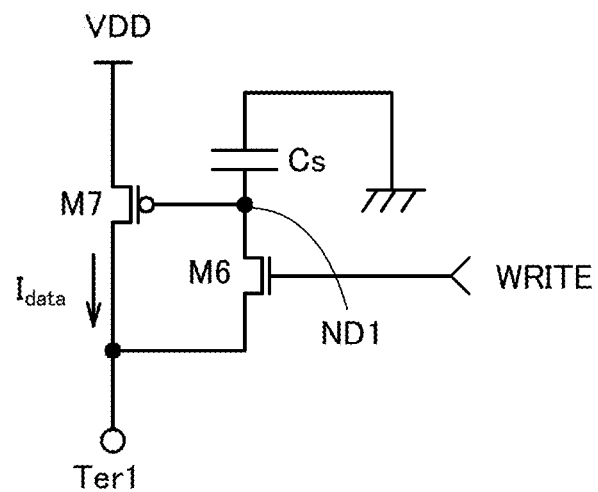
FIGS. 26A and 26B illustrate a configuration of a memory circuit and a configuration of a converter circuit, respectively.

FIG. 26A illustrates a configuration example where the transistors M6 and M7 in the memory circuit 12 illustrated in FIG. 3A are a n-channel transistor and an p-channel transistor, respectively. The memory circuit 12 illustrated in FIG. 26A includes the transistors M6 and M7, and the capacitor Cs. A signal WRITE is input to a gate of the transistor M6. One of a source and a drain of the transistor M6 is electrically connected to one of a source and a drain of the transistor M7. The other of the source and the drain of the transistor M6 is electrically connected to the gate of the transistor M7 and one electrode of the capacitor Cs. The other of the source and the drain of the transistor M7 is electrically connected to the node (wiring) that is supplied with the power supply voltage VDD.

The current $I_{data}$ from the converter circuit 11 is supplied through the terminal Ter1 to one of a source and a drain of each of the transistors M6 and M7. When the current $I_{data}$ is written into the memory circuit 12, the transistor M6 is turned on by controlling the potential of the signal WRITE. When the transistor M6 is on, one of a source and a drain of the transistor M7 is electrically connected to the gate of the transistor M7 through the transistor M6.

Figure 26B:
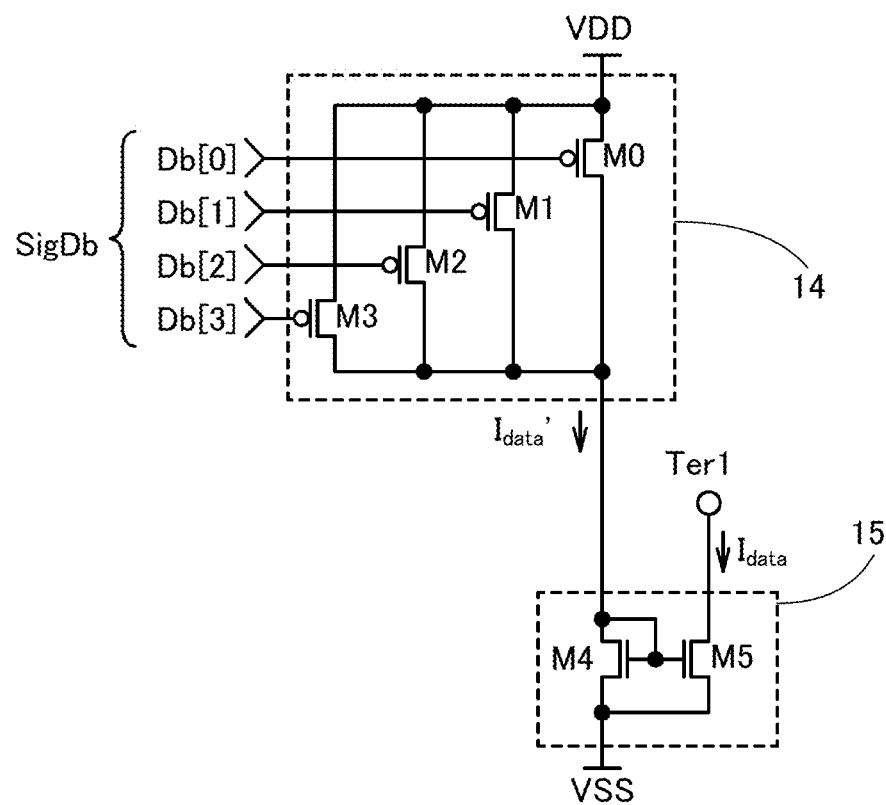

Next, a configuration example of the converter circuit 11 in the case where the transistor M7 is a p-channel transistor is described with reference to FIG. 26B. The switch circuit 14 illustrated in FIG. 26B is compatible with a signal SigDb which can be obtained by reversing the polarity of a 4-bit signal SigD, and includes the transistors M0 to M3 which are p-channel transistors that each correspond to each bit of digital data.

In the transistors M0 to M3, one of a source and a drain in each transistor is electrically connected to each other, and the other of the source and the drain in each transistor is electrically connected to each other. In addition, one of a source and a drain in each of the transistors M0 to M3 is each electrically connected to the current-mirror circuit 15, and the other of the source and the drain in each of the transistors M0 to M3 is each electrically connected to the node (wiring) that is supplied with the power supply voltage VDD.

The gates of the transistors M0, M1, M2 and M3 are supplied with the potential of a lowest-level bit Db[0] of the digital data, a second bit Db[1] of the digital data, a third bit Db[2] of the digital data, and a highest-level bit Db[3] of the digital data, respectively.

The current-mirror circuit 15 is supplied with the current $I_{data}$ that includes the same current value as the current $I_{data}'$ that flows across the switch circuit 14, or the current $I_{data}$ that includes a current value that corresponds to the current $I_{data}'$, through the terminal Ter1. Specifically, FIG. 26B illustrates a case where the current-mirror circuit 15 includes the n-channel transistors M4 and M5.

In both of the transistors M4 and M5, one of a source and a drain is electrically connected to the node (wiring) that is supplied with the power supply voltage VSS. The other of the source and the drain of the transistor M4 is electrically connected to the switch circuit 14. Furthermore, the other of the source and the drain of the transistor M5 is electrically connected to a terminal Ter1. The gates of the transistors M4 and M5 are electrically connected to each other, and the gate of the transistor M4 is electrically connected to the other of the source and the drain of the transistor M4.

The current $I_{data}'$ that flows across the switch circuit 14 flows through the transistor M4 of the current-mirror circuit 15 and between the node (wiring) that is supplied with a power supply voltage VDD and the node (wiring) that is supplied with a power supply voltage VSS. The current-mirror circuit 15 has a function of supplying the current $I_{data}$ that includes the same current value as the current $I_{data}'$ or supplying the current $I_{data}$ that includes a current value that corresponds to the current $I_{data}'$ between the node (wiring) that is supplied with the power supply voltage VSS and the terminal Ter1, through the transistor M5.

In the data comparison circuit 10 that includes the memory circuit 12 illustrated in FIG. 26A and the converter circuit 11 illustrated in FIG. 26B, the current comparison circuit 18 illustrated in FIG. 8 operates in a manner different from the manner described above. Specifically, when $I_{dif}>0$, the potential at the terminal Ter2 changes so as to oscillate between high and low levels at certain intervals. The oscillation frequency of the potential at the terminal Ter2 (i.e., the node ND5) becomes larger as the $I_{dif}$ becomes smaller. In addition, when $I_{dif}<0$, the potential at the terminal Ter3 changes so as to oscillate between high and low levels at certain intervals. Furthermore, the oscillation frequency of the potential at the terminal Ter3 (i.e., the node ND6) becomes larger as the $I_{dif}$ becomes larger.

This embodiment can be combined with any of the other embodiments as appropriate.

(Embodiment 2)

The determination circuit 19 illustrated in FIG. 9 has a function of generating data that includes information about the existence of difference between current values. In this embodiment, the determination circuit 19 may have a function of generating data that includes information about the amount of difference between current values. The use of the determination circuit 19 that has a function of generating data that includes information about the amount of difference between current values in the data comparison circuit 10 can enable the data comparison circuit 10 to function as a subtractor.

For example, the combinations of the values of bits in the digital data composed of four bits D[3], D[2], D[1] and D[0] are assumed as 0000, 0001, 0010, . . . , 1110 and 1111, and the current values of the current $I_{data}$ obtained in the converter circuit 11 from the digital data are assumed as $I_{00}$, $I_{01}$, $I_{02}$, . . . , $I_{14}$, and $I_{15}$. Using $I_{00}$ which has the smallest current value, $I_{01}$, $I_{02}$, . . . , $I_{14}$ and $I_{15}$ can be expressed as $2 \times I_{00}$, $3 \times I_{00}$, . . . , $15 \times I_{00}$ and $16 \times I_{00}$, respectively. Thus, a subtraction operation can be performed on digital data that correspond to reference data and digital data that correspond to comparison data, using the difference between the current value that corresponds to the reference data and the current value that corresponds to the comparison data.

For example, when the value of the reference data is 0010, the current value of the current $I_{data}$ that corresponds to the reference data is expressed as $I_{02}=3 \times I_{00}$. In addition, when the value of the comparison data is 0100, the current value of the current $I_{data}$ that corresponds to the comparison data is expressed as $I_{04}=5\times I_{00}$. Thus, the current value of the difference obtained by subtracting the reference data from the comparison data is expressed as $2\times I_{00}$. Accordingly, the difference between the reference data and the comparison data can be determined to be 2 in the decimal numeral system by detecting the current value as $2\times I_{00}$ in the determination circuit 19.

In the current comparison circuit 18 illustrated in FIG. 8, the potential at the node ND5 or the node ND6 oscillates at a certain oscillation frequency when there is difference between the reference data and the comparison data. In addition, the oscillation frequency described above varies depending on the current value of the drain current that flows through the transistor M15 or the transistor M16.

For example, when the current $I_{dif}$ flows through the transistor M16, the potential at the node ND4 starts to increase because of the input of the current $I_{dif}$. The speed of increase of the potential described above depends on the current value of the current $I_{dif}$. Specifically, when the current value of the current $I_{dif}$ is large, the potential at the node ND4 increases immediately. Conversely, when the current value of the current $I_{dif}$ is small, increase in the potential of the node ND4 is gradual. In addition, the comparator 22 starts to output a high-level potential when the potential at the node ND4 becomes higher than VREFP. This turns on the transistor M18, which causes the potential at the node ND4 to start to decrease. Repeating the operations described above causes the potentials at the nodes ND4 and ND6 to oscillate. Thus, when the current value of the current $I_{dif}$ is large, the oscillation frequency becomes high. In contrast, when the current value of the current $I_{dif}$ is small, the oscillation frequency becomes low.

The current value of the current $I_{dif}$ includes the information about the difference between the reference data and the comparison data. As a result, information about the difference between the reference data and the comparison data can be obtained from the oscillation frequency of the node ND5 or ND6.

An example of the determination circuit 19 that has a function of generating data that includes information about the difference between the currents $I_{data}1$ and $I_{data}2$ from the oscillation frequency is described with reference to FIG. 11 and FIGS. 12A and 12B.

Figure 11:
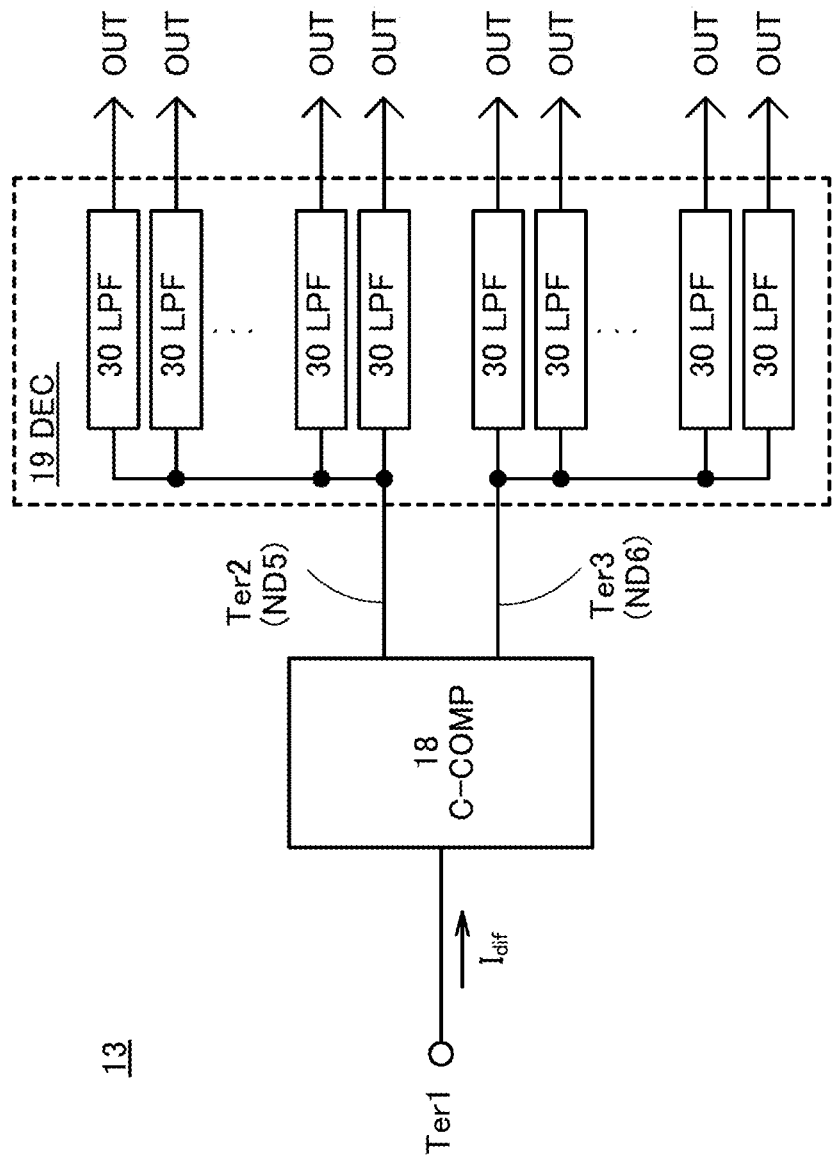
FIG. 11 illustrates a configuration of a detection circuit.

A configuration example of the detection circuit 13 is illustrated in FIG. 11. The detection circuit 13 illustrated in FIG. 11 includes the current comparison circuit 18 and the determination circuit 19. The determination circuit 19 illustrated in FIG. 11 has a function of generating data that includes information about the difference between the currents $I_{data}2$ and $I_{data}2$ using potentials output from the current comparison circuit 18, specifically, the potentials at the terminals Ter2 (the node ND5) and Ter3 (the node ND6).

Specifically, the determination circuit 19 illustrated in FIG. 11 includes a plurality of low-pass filters 30 (LPF) whose input terminals are electrically connected to the terminal Ter2 (the node ND5), and a plurality of low-pass filters 30 (LPF) whose input terminals are electrically connected to the terminal Ter3 (the node ND6).

Figure 12A:
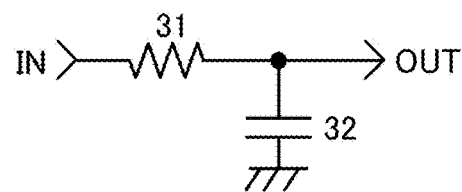
FIGS. 12A and 12B illustrate configurations of a low-pass filter and a determination circuit, respectively.

FIG. 12A illustrates a specific configuration example of the low-pass filter 30. The low-pass filter 30 illustrated in FIG. 12A includes a resistor 31 and a capacitor 32. One terminal of the resistor 31 is electrically connected to an input terminal IN of the low-pass filter 30, and the other terminal of the resistor 31 is electrically connected to an output terminal OUT of the low-pass filter 30. One electrode of the capacitor 32 is electrically connected to the other terminal of the resistor 31, and the other electrode of the capacitor 32 is electrically connected to a node (wiring) that is supplied with a predetermined potential, such as a ground potential or a reference potential.

Figure 12B:
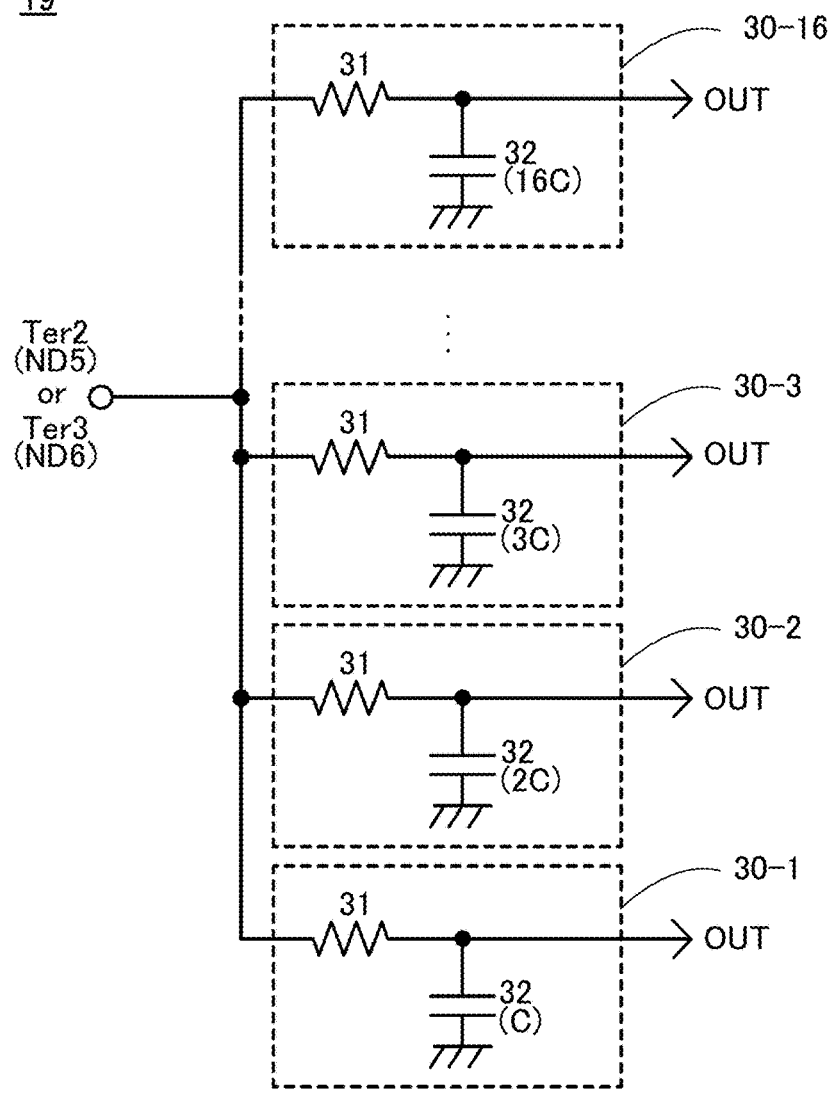

FIG. 12B illustrates an example of connections among the low-pass filters 30 by using sixteen low-pass filters 30 that are illustrated as low-pass filters 30-1 to 30-16. Note that in the low-pass filters 30-1 to 30-16 illustrated in FIG. 12B, it is assumed that their input terminals are electrically connected to the terminal Ter2 (the node ND5) or the terminal Ter3 (the node ND6).

In addition, FIG. 12B illustrates a case where the capacitor 32 included in each of the low-pass filters 30-1 to 30-16 each has a different capacitance. Specifically, when the capacitance of the capacitor 32 included in the low-pass filter 30-1 is designated as C, the capacitance Cp of the capacitor 32 included in the low-pass filter 30-p (p is a given natural number from 1 to 16) is expressed as p×C.

The low-pass filter 30 has a function of letting signals with frequencies lower than the cutoff frequency f through, and attenuating signals with frequencies higher than the cutoff frequency f. The cutoff frequency f is expressed as $\frac{1}{2\pi}RCp$ (R is the resistance of the resistor 31). The low-pass filters 30-1 to 30-16 have different capacitances Cp, which makes the cutoff frequency f for each of the low-pass filters different. Thus, the oscillation frequency of the node ND5 or the node ND6 can be determined by inputting the signal output from the current comparison circuit 18 to a plurality of low-pass filters 30 with different cutoff frequencies f, and monitoring the potential of the signal that is output from the output terminal of each of the low-pass filters 30. The information about the difference between the reference data and the comparison data can be obtained using the oscillation frequency described above.

Next, another example of the determination circuit 19 that has a function of generating data that includes information about the difference between the currents $I_{data}1$ and $I_{data}2$ from the oscillation frequency is described with reference to FIG. 13, FIG. 14, and FIGS. 15A and 15B.

Figure 13:
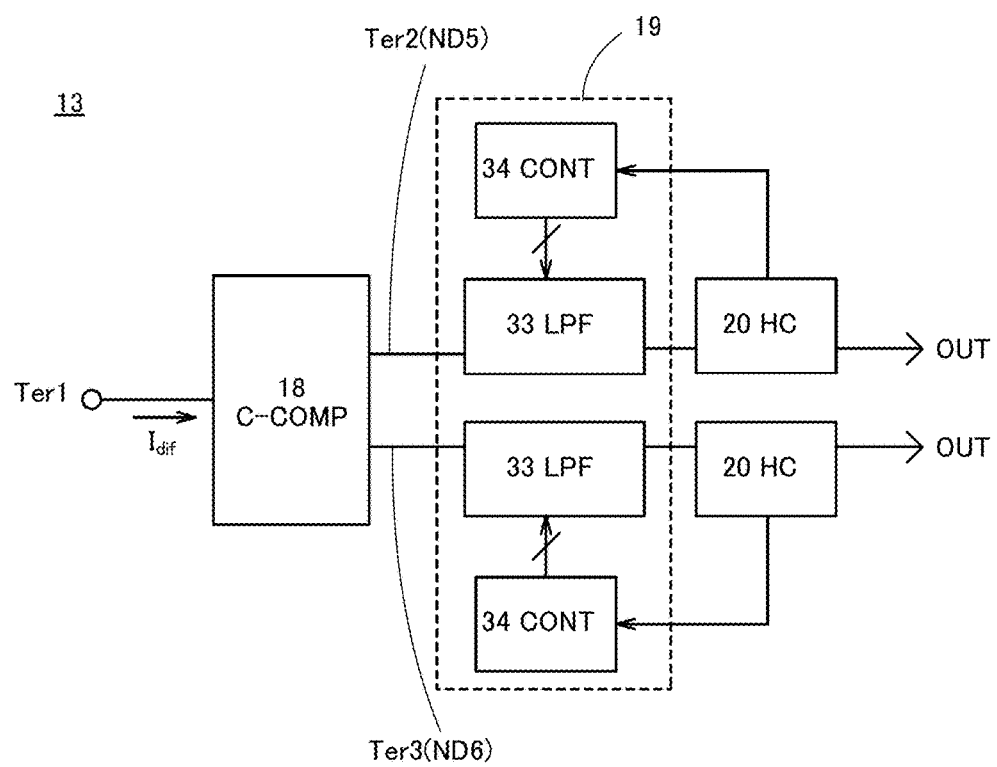
FIG. 13 illustrates a configuration of a detection circuit.

A configuration example of the detection circuit 13 is illustrated in FIG. 13. The detection circuit 13 illustrated in FIG. 13 includes the current comparison circuit 18, the determination circuit 19 and the retention circuit 20. The determination circuit 19 illustrated in FIG. 13 has a function of generating data that includes information about the difference between the currents $I_{data}1$ and $I_{data}2$ using potentials output from the current comparison circuit 18, specifically, the potentials at the terminals Ter2 (the node ND5) and Ter3 (the node ND6).

Specifically, the determination circuit 19 illustrated in FIG. 13 includes a low-pass filter 33 (LPF) whose input terminal is electrically connected to the terminal Ter2 (the node ND5) and a control circuit 34 that controls the operation of the low-pass filter 33. Furthermore, the determination circuit 19 illustrated in FIG. 13 includes the low-pass filter 33 (LPF) whose input terminal is electrically connected to the terminal Ter3 (the node ND6) and the control circuit 34 that controls the operation of the low-pass filter 33.

Figure 14:
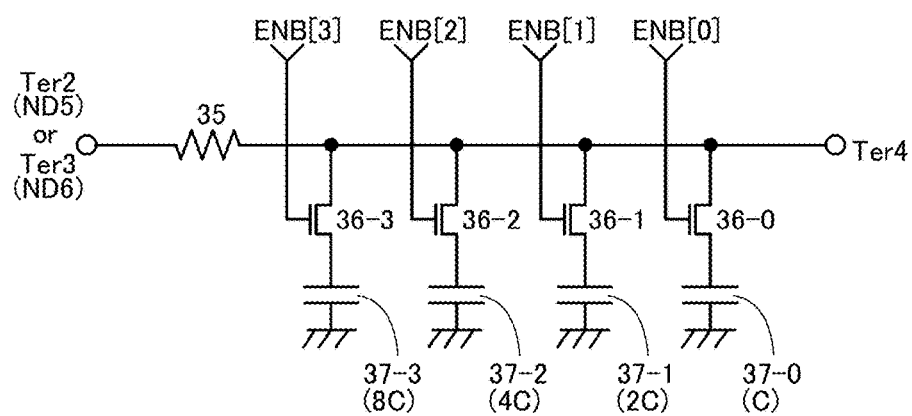
FIG. 14 illustrates a configuration of a low-pass filter.

A configuration example of the low-pass filter 33 is illustrated in FIG. 14. The low-pass filter 33 illustrated in FIG. 14 includes a resistor 35, a plurality of transistors 36 that functions as switches, and a plurality of capacitors 37. Note that FIG. 14 illustrates a case where the low-pass filter 33 includes four transistors 36, which are illustrated as transistors 36-0 to 36-3. In addition, FIG. 14 illustrates a case where the low-pass filter 33 includes four capacitors 37, which are illustrated as capacitors 37-0 to 37-3.

One terminal of the resistor 35 is electrically connected to the terminal Ter2 (the node ND5) or the terminal Ter3 (the node ND6), which corresponds to an input terminal. The other terminal of the resistor 35 is electrically connected to the terminal Ter4, which corresponds to an output terminal. One of a source and a drain of each of the transistors 36-0 to 36-3 is electrically connected to the terminal Ter4. The other of the source and the drain of each of the transistors 36-0 to 36-3 is electrically connected to one electrode of a corresponding capacitor from the capacitors 37-0 to 37-3. The other electrode of each of the capacitors 37-0 to 37-3 is electrically connected to the node (wiring) that is supplied with a predetermined potential, such as a ground potential or a reference potential.

In addition, signals ENB[0], ENB[1], ENB[2] and ENB[3] are input to the gates of the transistors 36-0, 36-1, 36-2 and 36-3, respectively. The conduction states of the transistors 36-0 to 36-3 are controlled by the signals ENB[0] to ENB[3], respectively.

FIG. 14 illustrates a case where the capacitors 37-0 to 37-3 each has a different capacitance. Specifically, when the capacitance of the capacitor 37-0 is designated as C, the capacitance Cq of the capacitor 37-q (q is a given integer from 0 to 3) is expressed as $2^q \times C$.

The low-pass filter 33 illustrated in FIG. 14 can vary the capacitance of the combined capacitance Ct that is composed of the capacitor(s) chosen from the capacitors 37-0 to 37-3, which are electrically connected to the output terminal OUT, by controlling each of the four transistors (illustrated as the transistors 36-0 to 36-3).

The low-pass filter 33 has a function of letting signals with frequencies lower than the cutoff frequency f through, and attenuating signals with frequencies higher than the cutoff frequency f. The cutoff frequency f is expressed as $1/2\pi RCq$ (R is the resistance of the resistor 35). Because the capacitance Ct is variable in the low-pass filter 33, the cutoff frequency f can be changed in accordance with the value of the capacitance Ct. Thus, the oscillation frequency of the nodes ND5 and ND6 can be determined by inputting the signal output from the current comparison circuit 18 to the low-pass filter 33 and monitoring the potential of the signal that is output from the output terminal of each of the low-pass filters 33 (the terminal Ter4), while changing the cutoff frequency f. The information about the difference between the reference data and the comparison data can be obtained using the oscillation frequency described above.

The use of the low-pass filter 33 illustrated in FIG. 14 in the determination circuit illustrated in FIG. 13 can reduce the number of capacitors, compared to the determination circuit 19 illustrated in FIG. 11.

Figure 15A:
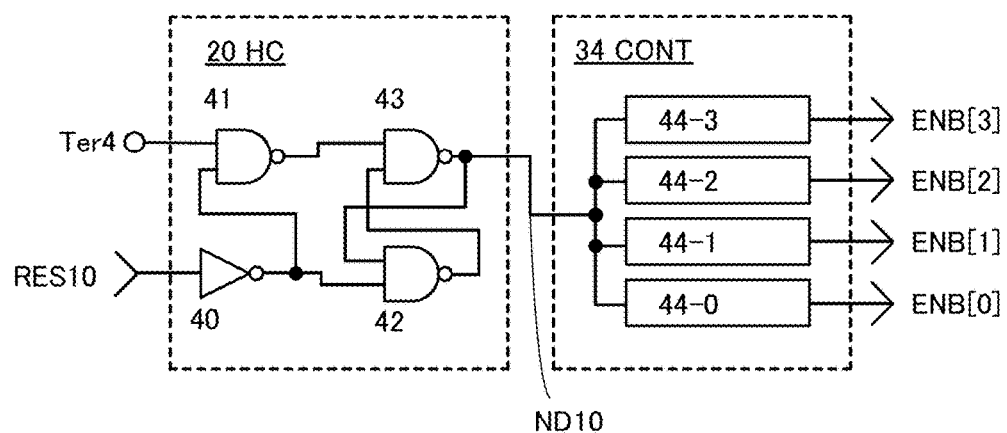
FIGS. 15A and 15B illustrate configurations of a retention circuit and a control circuit, respectively.

FIG. 15A illustrates a configuration example of the retention circuit 20 and a configuration example of the control circuit 34 that are illustrated in FIG. 13. The retention circuit 20 illustrated in FIG. 15A includes an inverter 40 and NANDs 41 to 43. A signal RES10 is input to the input terminal of the inverter 40. An output terminal of the inverter 40 is electrically connected to second input terminals of the NANDs 41 and 42. A signal output from the low-pass filter 33 is input through the terminal Ter4 to a first input terminal of the NAND 41. An output terminal of the NAND 41 is electrically connected to a first input terminal of the NAND 43. An output terminal of the NAND 42 is electrically connected to a second input terminal of the NAND 43. An output terminal of the NAND 43 is electrically connected to a first input terminal of the NAND 42. The output terminal of the NAND 43 corresponds to the output terminal of the retention circuit 20, and the potential of the signal is supplied to the control circuit 34.

In the retention circuit 20 illustrated in FIG. 15A, the potential at the output terminal is reset to a low level when the potential of the signal RES10 is set at a high level. After the potential is reset, the potential of the signal RES10 is set to a low level in the retention circuit 20 illustrated in FIG. 15A; when the potential at the terminal Ter4 is set at a low level, the potential at the output terminal retains the state immediately before the reset (state in which the potential of the output terminal is set at a low level), and after the potential at the terminal Ter4 is set at a high level, the potential at the output terminal remains at a high level regardless of changes in the potential at the terminal Ter4.

The control circuit 34 illustrated in FIG. 15A includes a plurality of signal generation circuits 44, which is illustrated as signal generation circuits 44-0 to 44-3. The input terminals of the signal generation circuits 44-0 to 44-3 are electrically connected to the output terminal of the retention circuit 20. In addition, each of the signal generation circuits 44 has a function of generating a signal to control the operation of the low-pass filter 33 that is illustrated in FIG. 14. Specifically, a signal generation circuit 44-n (n is a given integer from 0 to 3) has a function of generating a signal ENB[n].

Figure 15B:
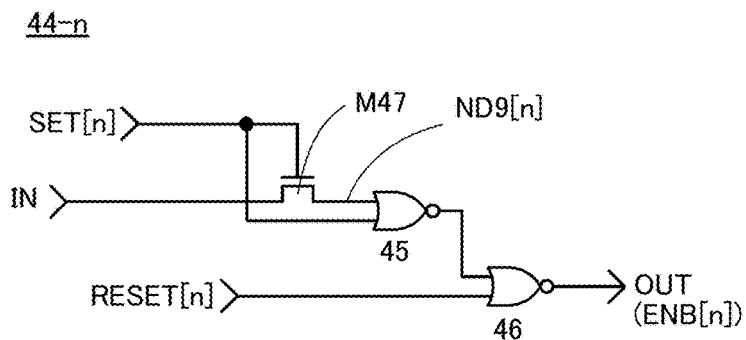

FIG. 15B illustrates a configuration example of the signal generation circuit 44-n. The signal generation circuit 44-n includes a transistor M47, a NOR 45, and a NOR 46. A signal SET[n] is input to a gate of the transistor M47. One of a source and a drain of the transistor M47 is electrically connected to an input terminal IN, and the other of the source and the drain of the transistor M47 is electrically connected to a first input terminal of the NOR 45. A second input terminal of the NOR 45 is electrically connected to the gate of the transistor M47. An output terminal of the NOR 45 is electrically connected to a first input terminal of the NOR 46, and a signal RESET[n] is input to a second input terminal of the NOR 46. The potential at an output terminal of the NOR 46 is output as the signal ENB[n].

Figure 16:
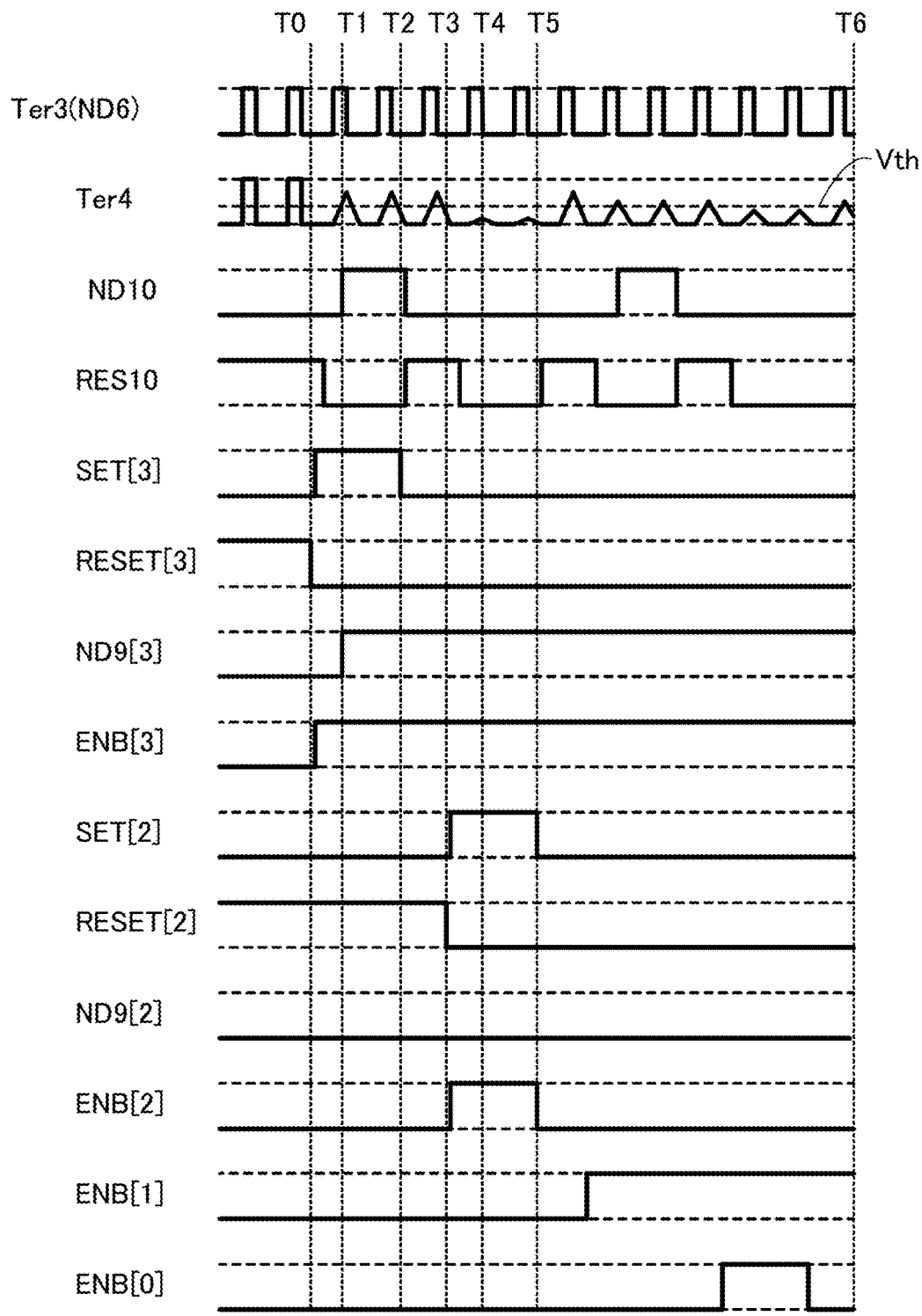
FIG. 16 is a timing chart.

Next, an example of the operation of the detection circuit 13 illustrated in FIG. 13 is described with reference to the timing chart illustrated in FIG. 16. Note that FIG. 16 illustrates a timing chart in the case where the detection circuit 13 illustrated in FIG. 13 includes the low-pass filter 33 illustrated in FIG. 14 and the retention circuit 20 and the control circuit 34 that are illustrated in FIG. 15A, and where the control circuit 34 includes the signal generation circuits 44-0 to 44-4 that have the same configuration as the signal generation circuit 44-n illustrated in FIG. 15B. In addition, the timing chart illustrated in FIG. 16 assumes the case where the difference between the reference data and the comparison data is represented as 10 in the decimal numeral system.

In periods before time T0, the potentials of the signals RESET[0] to RESET[3] that are input to the signal generation circuits 44-0 to 44-3 illustrated in FIG. 15A are set at a high level, and the potentials of the signals ENB[0], ENB[1], ENB[2] and ENB[3] that are output from the signal generation circuits 44-0, 44-1, 44-2 and 44-3, respectively, are reset at a low level. Thus, the transistors 36-0 to 36-3 that are included in the low-pass filter 33 illustrated in FIG. 14 are all turned off.

Accordingly, the capacitance of the combined capacitance Ct that is connected to the terminal Ter4 in the low-pass filter 33 illustrated in FIG. 14 takes the smallest value. Thus, the signal input to the terminal Ter3 is directly conveyed to the terminal Ter4.

Furthermore, in periods before time T0, the potential of the signal RES10 is set at a high level, and the potential at the output terminal OUT of the retention circuit 20 illustrated in FIG. 15A is reset at a low level.

Next, at time T0, the potential of the signal RESET[3] changes from a high level to a low level. Then, the potential of the signal SET[3] that is input to the signal generation circuit 44-3 illustrated in FIG. 15A changes from a low level to a high level, so as to change the potential of the signal ENB[3] from the low level to a high level. When the potential of the signal ENB[3] is set at the high level, the transistor 36-3 in the low-pass filter 33 illustrated in FIG. 14 is turned on. Thus, the capacitance of the combined capacitance Ct that is connected to the terminal Ter4 is substantially equal to the capacitance of the capacitor 37-3, which is 8C.

This description assumes the case where the difference between the reference data and the comparison data is represented as 10 in the decimal numeral system. Thus, in the low-pass filter 33, the signal input to the terminal Ter3 is output from the terminal Ter4 after a certain amount of delay. In this state, the potential of the signal RES10 is changed from the high level to a low level so as to determine the potential at the output terminal OUT of the retention circuit 20 illustrated in FIG. 15A in accordance with the potential at the terminal Ter4. In a period after time T0 and before time T1, the potential at the terminal Ter4 is lower than the threshold voltage Vth of the n-channel transistor in the NAND 41 in the retention circuit 20 illustrated in FIG. 15A. Thus, the potential at the output terminal OUT of the retention circuit 20 is retained at a low level.

When the potential at the terminal Ter4 increases to a level that surpasses the threshold voltage Vth described above in time T1, the potential at the output terminal of the NAND 41 changes from a low level to a high level, and the potential at the output terminal OUT of the retention circuit 20 changes from the low level to a high level. Furthermore, the potential of the signal SET[3] is set at the high level. Thus, the transistor M47 in the signal generation circuit 44-3 is in an on state. Therefore, when the first input terminal of the NOR 45 included in the signal generation circuit 44-3 is designated as a node ND9[3] (refer to FIG. 15B), the potential at the output terminal OUT changes from a low level to a high level, which changes the potential at the node ND9[3] from a low level to a high level.

Next, in time T2, the potential of the signal SET[3] changes from a high level to a low level, turning off the transistor M47. The use of a transistor with an extremely low off-state current as the transistor M47 can ensure a long retention time of the potential at the node ND9[3]. When the potential at the node ND9[3] is retained at the high level, the potential of the signal ENB[3] is retained at the high level even when the potential of the signal SET[3] is set at the low level. Thus, the transistor 36-3 included in the low-pass filter 33 illustrated in FIG. 14 retains its on state.

Next, the potential of the signal RES10 is changed from the low level to the high level so that the potential at the output terminal OUT of the retention circuit 20 is reset to a low level.

Next, in time T3, the potential of the signal RESET[2] changes from a high level to a low level. Then, the potential of the signal SET[2] that is input to the signal generation circuit 44-2 illustrated in FIG. 15A changes from a low level to a high level, so as to change the potential of the signal ENB[2] from a low level to a high level.

When the potential of the signal ENB[2] is set at a high level, the transistor 36-2 in the low-pass filter 33 illustrated in FIG. 14 is turned on. In addition, the transistor 36-3 is retaining its on state; accordingly, the capacitance of the combined capacitance Ct that is connected to the terminal Ter4 becomes substantially equivalent to 12C, which is a value obtained by adding 4C (the capacitance of the capacitor 37-2) and 8C (the capacitance of the capacitor 37-3).

This description assumes the case where the difference between the reference data and the comparison data is represented as 10 in the decimal numeral system. Thus, when the capacitance of the combined capacitance Ct is expressed as 12C, the signal input to the terminal Ter3 of the low-pass filter 33 is attenuated, and the output thereof from the terminal Ter4 is stopped. In other words, the potential at the terminal Ter4 becomes lower than the threshold voltage Vth of the n-channel transistor included in the NAND 41.

Next, at time T4, the potential at the terminal Ter4 is lower than the threshold voltage Vth described above; thus, the potential at the output terminal OUT of the retention circuit 20 is retained at the low level. The transistor M47 in the signal generation circuit 44-2 is in an on state because the potential of the signal SET[2] is set at the high level. At this time, the potential at the node ND9[2] is retained at a low level.

Next, in time T5, the potential of the signal SET[2] changes from a high level to a low level. Because the potential at the node ND9[2] is set at a low level, the potential of the signal ENB[2] changes from a high level to a low level. Accordingly, in the low-pass filter 33 illustrated in FIG. 14, the transistor 36-2 is turned off.

Repeating similar oparations successively changes the capacitance of the combined capacitance Ct in the low-pass filter 33 illustrated in FIG. 14, which allows the conversion of the frequency of the signal input from the terminal Ter3 to a digital value. In a period from time T0 to time T6, the potentials for all the signals ENB[0] to ENB[3] are determined. The potentials of the signals ENB[0] to ENB[3] include the information about whether the signal input to the terminal Ter3 is output from the terminal Ter4, when the transistors 36-0 to 36-3 that correspond to the signals ENB[0] to ENB[3], respectively, are turned on. Thus, a difference between the reference data and the comparison data can be obtained from the potentials of the signals ENB[0] to ENB[3].

Specifically, at time T6, the potentials of the signals ENB[3], ENB[2], ENB[1], and ENB[0] are set at the high level, the low level, a high level, and the low level, respectively. Thus, the difference can be calculated to be 1010 in a binary numerical system, and 10 in the decimal numerical system.

As described above, the data comparison circuit 10 of one embodiment of the present invention can perform a subtraction operation on digital data of multiple bits.

This embodiment can be combined with any of the other embodiments as appropriate.

(Embodiment 3)

Figure 17:
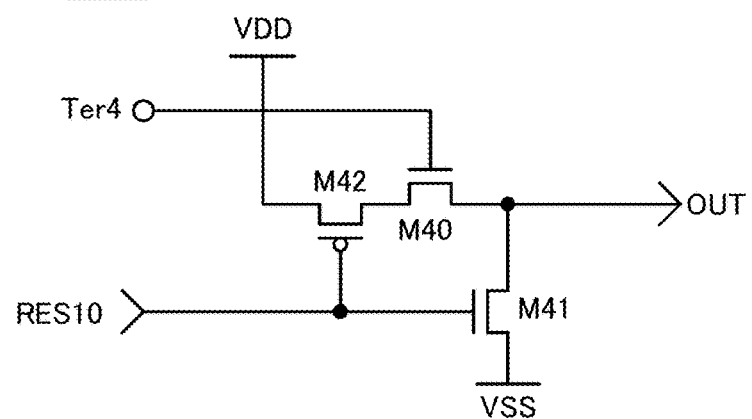
FIG. 17 illustrates a configuration of a retention circuit.

FIG. 17 illustrates another configuration example of the retention circuit 20 illustrated in FIG. 15A.

The retention circuit 20 illustrated in FIG. 17 includes transistors M40 to M42.

FIG. 17 illustrates an example where the transistors M40 and M41 are n-channel transistors and the transistor M42 is a p-channel transistor.

The signal RES10 is input to a gate of the transistor M42. One of a source and a drain of the transistor M42 is electrically connected to the node (wiring) that is supplied with the power supply voltage VDD, and the other of the source and the drain of the transistor M42 is electrically connected to one of a source and a drain of the transistor M40. A signal output from the low-pass filter 33 is input, through the terminal Ter4, to a gate of the transistor M40. The other of the source and the drain of the transistor M40 is electrically connected to the output terminal OUT of the retention circuit 20. A gate of the transistor M41 is electrically connected to the gate of the transistor M42. One of a source and a drain of the transistor M41 is electrically connected to the node (wiring) that is supplied with the power supply voltage VSS. The other of the source and the drain of the transistor M41 is electrically connected to the output terminal OUT.

When the potential of the signal RES10 is set at a high level, the transistor M41 is turned on, resetting the potential at the output terminal OUT to a low level. When a high-level potential is supplied to the terminal Ter4 in this state, the transistor M40 is turned on. The transistor M42 is in an off state as the potential of the signal RES10 is set at a high level. Thus, the flow of a flow-through current between the node (wiring) that is supplied with the power supply voltage VDD and the node (wiring) that is supplied with the power supply voltage VSS can be prevented.

Next, when the potential of the signal RES10 is changed from the high level to a low level, the transistor M41 is turned off, and the transistor M42 is turned on. In this state, when the potential of the signal input to the terminal Ter4 changes to the high level even once, the transistor M40 is turned on, thereby changing the potential at the output terminal OUT from the low level to a high level. In addition, after the potential at the output terminal OUT changes from the low level to the high level even once, the high-level potential is retained at the output terminal OUT.

The use of a transistor with extremely low off-state current as the transistors M40 and M41 can ensure a long retention time of the potential at the output terminal OUT.

This embodiment can be combined with any of the other embodiments as appropriate.

(Embodiment 4)

Next, a configuration example of a transistor with an oxide semiconductor is described.

Figure 18A:
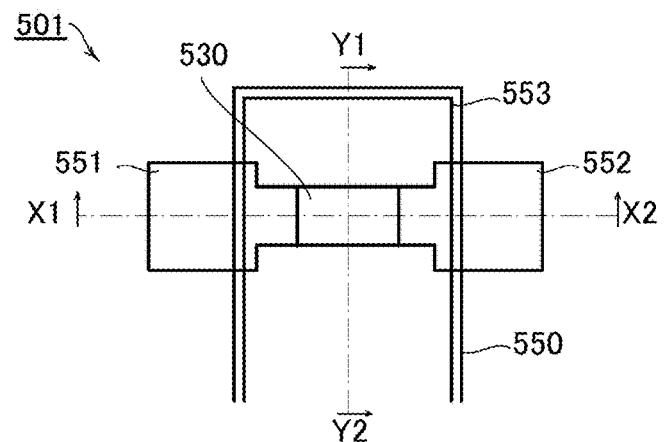
FIGS. 18A to 18C illustrate a structure of a transistor.
Figure 18B:
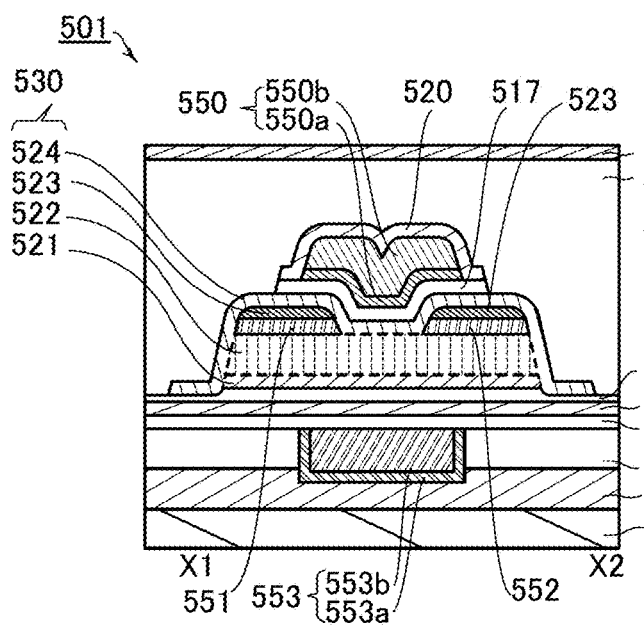
Figure 18C:
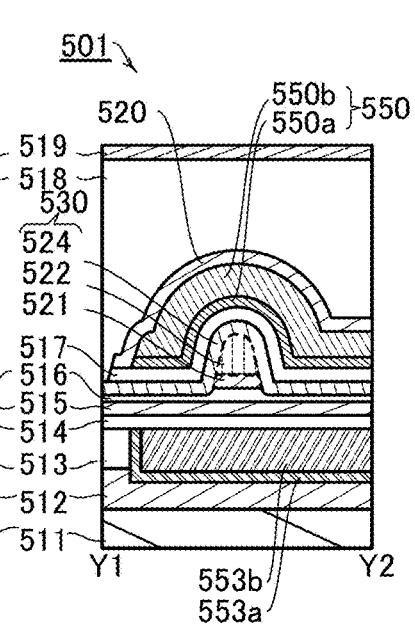

FIG. 18A is a top view illustrating a structure example of a transistor. FIG. 18B is a cross-sectional view taken along the line X1-X2 in FIG. 18A, and FIG. 18C is a cross-sectional view taken along the line Y1-Y2 in FIG. 18A. Here, the direction of the line X1-X2 may be referred to as a channel length direction, and the direction of the line Y1-Y2 may be referred to as a channel width direction. FIG. 18B illustrates a cross-sectional structure of the transistor in the channel length direction, and FIG. 18C illustrates a cross-sectional structure of the transistor in the channel width direction. Note that to clarify the device structure, FIG. 18A does not illustrate some components.

The semiconductor device of one embodiment of the present invention includes insulating layers 512 to 520, metal oxide films 521 to 524, and conductive layers 550 to 553. A transistor 501 is formed over an insulating surface. FIGS. 18A to 18C illustrates a case where the transistor 501 is formed over the insulating layer 511. The transistor 501 is covered by the insulating layers 518 and 519.

Note that the insulating layers, the metal oxide films, the conductive layers or the like that constitute the transistor 501 may each be a single film, or a stack of multiple films. These films and layers can be formed by any of a variety of deposition methods such as sputtering, molecular beam epitaxy (MBE), pulsed laser deposition (PLD), chemical vapor deposition (CVD), and atomic layer deposition (ALD). Examples of CVD include plasma CVD, thermal CVD, and metal organic CVD.

The conductive layer 550 includes a region that functions as a gate electrode of the transistor 501. The conductive layers 551 and 552 include regions that function as a source electrode and a drain electrode. The conductive layer 553 includes a region that functions as a back gate electrode. The insulating layer 517 includes a region that functions as a gate insulating layer on the gate electrode (front gate electrode) side, and an insulating layer that is composed of the insulating layers 514 to 516 includes a region that functions as a gate insulating layer on the back gate electrode side. The insulating layer 518 can serve as an interlayer insulating layer. The insulating layer 519 can serve as a barrier layer.

The metal oxide films 521 to 524 will be collectively designated as an oxide layer 530. As shown in FIGS. 18B and 18C, the oxide layer 530 includes a region where the metal oxide film 521, the metal oxide film 522, and the metal oxide film 524 are stacked in that order. In addition, a pair of the metal oxide films 523 is positioned over the conductive layer 551 and the conductive layer 552. When the transistor 501 is on, a channel formation region is mainly formed in the metal oxide film 522 of the oxide layer 530.

The metal oxide film 524 covers the metal oxide films 521 to 523, the conductive layer 551, and the conductive layer 552. The insulating layer 517 is positioned between the metal oxide film 523 and the conductive layer 550. The conductive layers 551 and 552 each include a region that overlaps the conductive layer 550 with the metal oxide film 523, the metal oxide film 524 and the insulating layer 517 positioned therebetween.

The conductive layers 551 and 552 are fabricated from a hard mask that is used in the formation of the metal oxide films 521 and 522. Thus, the conductive layers 551 and 552 do not include a region that is in contact with the side surfaces of the metal oxide films 521 and 522. For example, the metal oxide films 521 and 522 and the conductive layers 551 and 552 can be formed through the following steps. First, a conductive film is formed over a stack of two metal oxide films. The conductive film is processed (etched) into a desired shape, forming a hard mask. The hard mask is used to process the shape of the two-layered metal oxide film, forming the metal oxide films 521 and 522 that are stacked. Next, the hard mask is processed into a desired shape, forming the conductive layers 551 and 552.

Examples of insulating materials used for the insulating layers 511 to 518 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 511 to 518 are formed using a single-layer structure or a stack of these insulating materials. The layers used for the insulating layers 511 to 518 may include a plurality of insulating materials.

Note that in this specification and the like, an oxynitride refers to a substance that contains more oxygen than nitrogen, and a nitride oxide refers to a substance that contains more nitrogen than oxygen.

In order to inhibit the increase in oxygen vacancies in the oxide layer 530, the insulating layers 516 to 518 preferably include oxygen. More preferably, at least one of the insulating layers 516 to 518 is formed using an insulating film from which oxygen is released by heating (hereinafter such an insulating film is referred to as an insulating film containing excess oxygen). When oxygen is supplied from the insulating film containing excess oxygen to the oxide layer 530, the oxygen vacancies in the oxide layer 530 can be compensated. Thus, reliability and electrical characteristics of the transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The hydrogen concentration in the insulating layers 512 to 519 is preferably low in order to prevent an increase in the hydrogen concentration in the oxide layer 530. In particular, the concentration of hydrogen in the insulating layers 513 to 518 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The nitrogen concentration in the insulating layers 513 to 518 is preferably low in order to prevent an increase in the nitrogen concentration in the oxide layer 530. Specifically, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The hydrogen concentration and the nitrogen concentration described above are measured by secondary ion mass spectrometry (SIMS).

In the transistor 501, the oxide layer 530 is preferably surrounded by an insulating layer with oxygen and hydrogen barrier properties (hereinafter such an insulating layer is referred to as a barrier layer). A use of such a structure prevents release of oxygen from the oxide layer 530, and intrusion of hydrogen into the oxide layer 530. Thus, reliability and electrical characteristics of the transistor 501 can be improved.

For example, the insulating layer 519 functions as a barrier layer and at least one of the insulating layers 511, 512, and 514 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

Structure example of the insulating layers 511 to 518 is described. In this example, each of the insulating layers 511, 512, 515, and 519 function as a barrier layer. The insulating layers 516 to 518 are oxide layers containing excess oxygen. The insulating layer 511 is formed using silicon nitride. The insulating layer 512 is formed using aluminum oxide. The insulating layer 513 is formed using silicon oxynitride. The insulating layers 514 to 516 that serve as the gate insulating layers in the back gate side are formed using a stack of silicon oxide, aluminum oxide, and silicon oxide. The insulating layer 517 that serves as the gate insulating layer in the front gate side is formed using silicon oxynitride. The insulating layer 518 that serves as the interlayer insulating layer is formed using silicon oxide. The insulating layer 519 is formed using aluminum oxide.

Examples of a conductive material used for the conductive layers 550 to 553 include a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). Alternatively, materials such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used for the conductive layers 550 to 553.

Structure example of the conductive layers 550 to 553 is described. The conductive layer 550 is a single layer of tantalum nitride or tungsten. Alternatively, the conductive layer 550 is a stack of tantalum nitride and tantalum or tantalum nitride. The conductive layer 551 is formed with a single layer of tantalum nitride, or a stack of tantalum nitride and tungsten. The structure of the conductive layer 552 is the same as that of the conductive layer 551. The conductive layer 553a is composed of tantalum nitride, and the conductive layer 553b is composed of tungsten.

In order to reduce the off-state current of the transistor 501, for example, the energy gap of the metal oxide film 522 is preferably large. The energy gap of the metal oxide film 522 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 530 preferably exhibits crystallinity. At least the metal oxide film 522 preferably exhibits crystallinity. With the structure described above, the transistor 501 can have high reliability and favorable electrical characteristics.

As the oxide of the metal oxide film 522, typically, an In-Ga oxide, an In—Zn oxide, or an In-M-Zn oxide (M is Al, Ga, Y, or Sn) can be used. The metal oxide film 522 is not limited to the oxide layer containing indium. The metal oxide film 522 can be formed using a Zn—Sn oxide, a Ga—Sn oxide, or a Zn—Mg oxide, for example. The metal oxide films 521, 523 and 524 can be formed using an oxide that is similar to the oxide of the metal oxide film 522. In particular, each of the metal oxide films 521, 523 and 524 can be formed with Ga oxide.

When an interface level is formed at the interface between the metal oxide film 522 and the metal oxide film 521, a channel region is formed also in the vicinity of the interface, which causes a change in the threshold voltage of the transistor 501. It is preferable that the metal oxide film 521 contains at least one of the metal elements contained in the metal oxide film 522. Accordingly, an interface level is unlikely to be formed at the interface between the metal oxide film 522 and the metal oxide film 521, and variations in the electrical characteristics of the transistor 501, such as the threshold voltage can be reduced.

It is preferable that the metal oxide film 524 contains at least one of the metal elements contained in the metal oxide film 522 as its component because interface scattering is unlikely to occur at the interface between the metal oxide film 522 and the metal oxide film 524, and carrier transfer is not inhibited. Thus, the field-effect mobility of the transistor 501 can be increased.

It is preferable that the metal oxide film 522 have the highest carrier mobility among the metal oxide films 521 to 524. Accordingly, a channel can be formed in the metal oxide film 522 that is apart from the insulating layers 516 and 517.

For example, in a metal oxide containing indium such as an In-M-Zn oxide, carrier mobility can be increased by an increase in the indium content. In the In-M-Zn oxide, the s orbital of heavy metal mainly contributes to carrier transfer, and when the indium content in the oxide semiconductor is increased, overlaps of the s orbitals of indium atoms are increased; therefore, an oxide having a high content of indium has higher mobility than an oxide having a low content of indium. Therefore, an oxide having a high content of indium is used as an oxide semiconductor film, so that carrier mobility can be increased.

Thus, for example, the metal oxide film 522 is formed using an In—Ga—Zn oxide, and the metal oxide films 521 and 523 are formed using a Ga oxide. For example, when the metal oxide films 521 to 523 are formed using an In-M-Zn oxide, the indium content of the metal oxide film 522 is made higher than the indium content of the metal oxide films 521 and 523. When the In-M—Zn oxide is formed by sputtering, the indium content can be changed by a change in the atomic ratio of metal elements of a target.

For example, it is preferable that the atomic ratio of metal elements of a target used for depositing the metal oxide film 522 be In:M:Zn=1:1:1, 3:1:2, or 4:2:4.1. For example, it is preferable that the atomic ratio of metal elements of a target used for depositing the metal oxide films 521 and 523 be In:M:Zn=1:3:2, or 1:3:4. The atomic ratio of an In-M-Zn oxide deposited using a target of In:M:Zn=4:2:4.1 is approximately In:M:Zn=4:2:3.

For the transistor 501 to have stable electrical characteristics, it is preferable to reduce the concentration of impurities in the oxide layer 530. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration of electrical characteristics of the transistor.

For example, the oxide layer 530 includes a region where the concentration of silicon is lower than or equal to $2 \times 10^{18}$ atoms/cm$^3$, or preferably lower than or equal to $2 \times 10^{17}$ atoms/cm$^3$. The same applies to the concentration of carbon in the oxide layer 530.

The oxide layer 530 includes a region where the concentration of alkali metal is lower than or equal to $1 \times 10^{18}$ atoms/cm$^3$, or preferably lower than or equal to $2 \times 10^{16}$ atoms/cm$^3$. The same applies to the concentration of alkaline earth metal in the metal oxide film 522.

The oxide layer 530 includes a region where the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The oxide layer 530 includes a region where the concentration of hydrogen is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The above concentrations of the impurities in the metal oxide film 522 are measured by SIMS.

In the case where the metal oxide film 522 contains oxygen vacancies, donor levels are formed by entry of hydrogen into sites of oxygen vacancies in some cases, to cause reduction in the on-state current of the transistor 501. Note that sites of oxygen vacancies become more stable by entry of oxygen than by entry of hydrogen. Thus, by reducing oxygen vacancies in the metal oxide film 522, the on-state current of the transistor 501 can be increased in some cases. Consequently, preventing entry of hydrogen into sites of oxygen vacancies by a reduction in hydrogen in the metal oxide film 522 is effective in improving on-state current characteristics.

Hydrogen contained in a metal oxide reacts with oxygen bonded to a metal atom to be water, and thus causes an oxygen vacancy, in some cases. An electron serving as a carrier is generated due to entry of hydrogen into the oxygen vacancy, in some cases. Furthermore, in some cases, bonding of part of hydrogen to oxygen bonded to a metal atom causes generation of an electron serving as a carrier. Thus, the transistor 501 is likely to be normally-on when the metal oxide film 522 contains hydrogen because the metal oxide film 522 includes a channel formation region. Accordingly, it is preferable that hydrogen in the metal oxide film 522 be reduced as much as possible.

FIGS. 18A to 18C illustrate examples in which the oxide layer 530 has a four-layer structure; however, one embodiment of the present invention is not limited thereto. For example, the oxide layer 530 can have a three-layer structure without the metal oxide film 521 or without the metal oxide film 523. Alternatively, the oxide layer 530 may include one or more metal oxide layers that are similar to the metal oxide films 521 to 524 at two or more of the following positions: between given layers in the oxide layer 530, over the oxide layer 530, and below the oxide layer 530.

Figure 19:
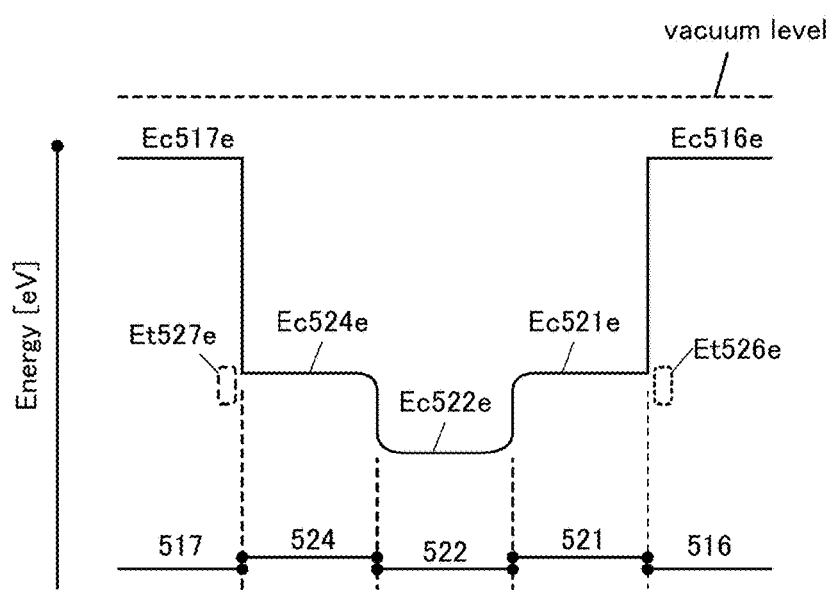
FIG. 19 is a schematic diagram of an energy band structure.

Effects of the stack of the metal oxide films 521, 522, and 524 are described with reference to FIG. 19. FIG. 19 is a schematic diagram showing the energy band structure of a channel formation region of the transistor 501.

In FIG. 19, Ec516e, Ec521e, Ec522e, Ec524e, and Ec517e indicate the energy of the bottom of the conduction band of the insulating layer 516, the oxide semiconductor film 521, the oxide semiconductor film 522, the oxide semiconductor film 524, and the insulating layer 517, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layers 516 and 517 are insulators, Ec516e and Ec517e are closer to the vacuum level than Ec521e, Ec522e, and Ec524e (i.e., the insulating layers 516 and 517 have a lower electron affinity than the metal oxides films 521, 522, and 524).

The metal oxide film 522 has a higher electron affinity than the metal oxide films 521 and 524. For example, the difference in electron affinity between the metal oxide films 521 and 522 and the difference in electron affinity between the metal oxide films 522 and 524 are each greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the transistor 501, a channel is mainly formed in the metal oxide film 522 having the highest electron affinity among the metal oxide films 521, 522, and 524.

An indium gallium oxide has low electron affinity and a high oxygen-blocking property. Therefore, the metal oxide film 524 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide films 521 and 522 between the metal oxide films 521 and 522. Furthermore, in some cases, there is a mixed region of the metal oxide films 522 and 524 between the metal oxide films 522 and 524. Because the mixed region has low interface state density, a region with a stack formed with the metal oxide films 521, 522, and 524 has a band structure where energy at each interface and in the vicinity of the interface is changed continuously (continuous junction).

Electrons transfer mainly through the metal oxide film 522 in the oxide layer 530 having such an energy band structure. Therefore, even when an interface state exists at an interface between the metal oxide film 521 and the insulating layer 516 or an interface between the metal oxide film 524 and the insulating layer 517, electron movement in the oxide layer 530 is less likely to be inhibited and the on-state current of the transistor 501 can be increased.

Although trap states Et526*e* and Et527*e* due to impurities or defects might be formed in the vicinity of the interface between the metal oxide film 521 and the insulating layer 516 and the vicinity of the interface between the metal oxide film 524 and the insulating layer 517 as illustrated in FIG. 19, the metal oxide film 522 can be separated from the trap states Et526*e* and Et527*e* owing to the existence of the metal oxide films 521 and 524.

Note that when a difference between Ec521*e* and Ec522*e* is small, an electron in the metal oxide film 522 might reach the trap state Et526*e* by passing over the difference in energy. Since the electron is trapped at the trap state Et526*e*, negative fixed charge is generated at the interface with the insulating film, causing the threshold voltage of the transistor to be shifted in a positive direction. The same applies to the case where a difference in energy between Ec521*e* and Ec524*e* is small.

Each of the difference in energy between Ec521*e* and Ec522*e* and the difference in energy between Ec522*e* and Ec524*e* is preferably greater than or equal to 0.1 eV, further preferably greater than or equal to 0.15 eV so that a change in the threshold voltage of the transistor 501 can be reduced and the transistor 501 can have favorable electrical characteristics.

The transistor 501 does not necessarily include a back gate electrode.

Figure 20:
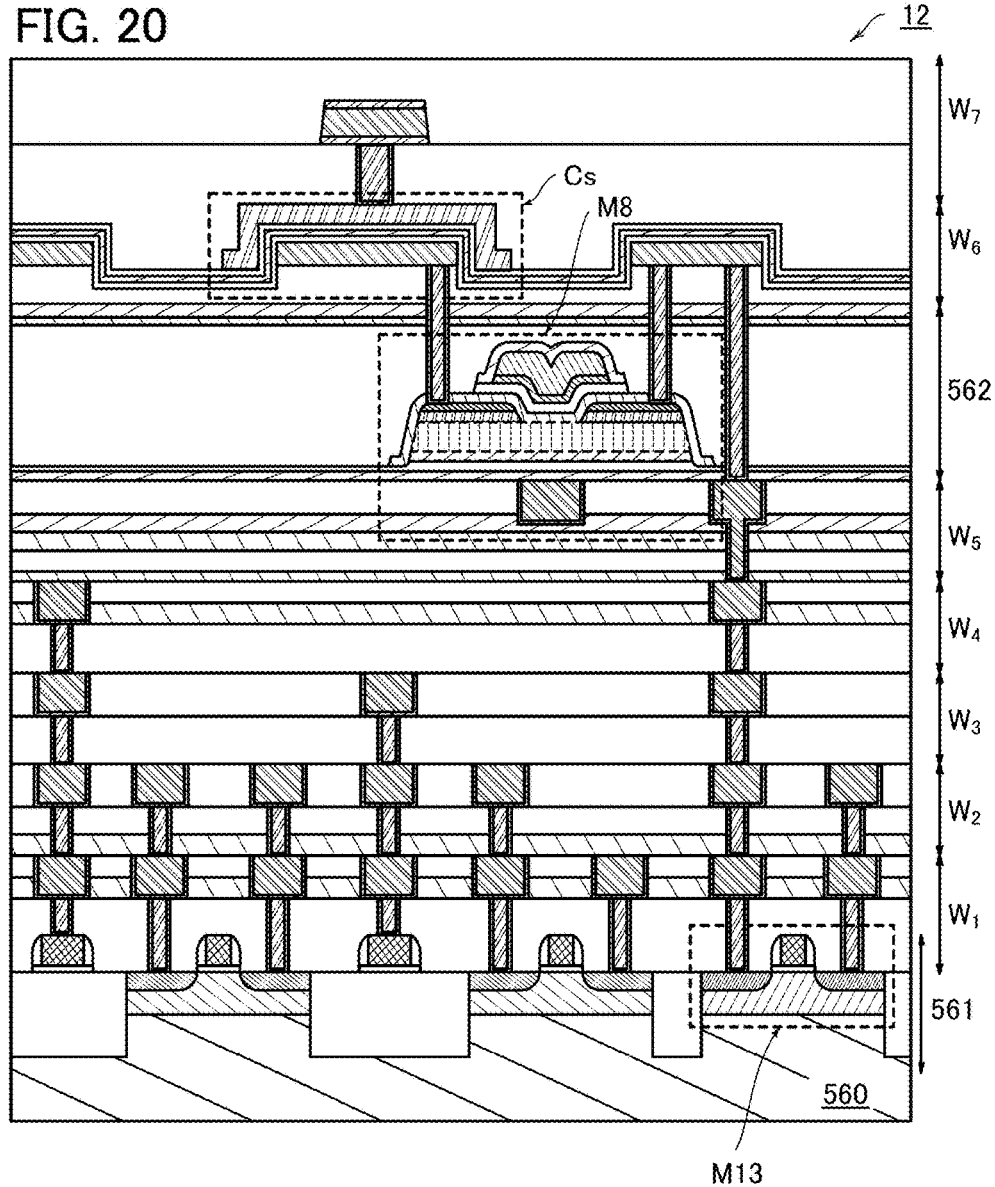
FIG. 20 illustrates a cross-sectional structure of a semiconductor device.

FIG. 20 illustrates a stack structure of the transistor M8 and the capacitor Cs included in the memory circuit 12 illustrated in FIG. 4B, and the transistor M13.

The data comparison circuit 10 includes a stack of a CMOS layer 561, wiring layers $W_1$ to $W_5$, a transistor layer 562, and wiring layers $W_6$ and $W_7$.

A transistor including silicon in a channel formation region is provided in the CMOS layer 561. Active layers of the transistors M13 are formed using a single crystalline silicon wafer 560.

The transistor M8 is provided in the transistor layer 562. The transistor M8 in FIG. 20 has a structure similar to that of the transistor 501 in FIGS. 18A to 18C. The back gate electrodes of these transistors are formed in the wiring layer $W_5$. The capacitor Cs is formed in the wiring layer $W_6$.

This embodiment can be combined with any of the other embodiments as appropriate.

(Embodiment 5)

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

A CAAC-OS is one of oxide semiconductors having a plurality of c-axis aligned crystal parts (also referred to as pellets).

As described above, the CAAC-OS has c-axis alignment, includes crystal parts (nanocrystals) connected in the a-b plane direction, and has a crystal structure with distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has reduced impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Note that there is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The carrier density of an oxide semiconductor is described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ $cm^{-3}$, preferably lower than $1 \times 10^{11}$ $cm^{-3}$, and further preferably lower than $1 \times 10^{10}$ $cm^{-3}$ and is higher than or equal to $1 \times 10^{-9}$ $cm^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the Id-Vg characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has a slightly n-type conductivity; thus, it can be referred to as a "slightly-n" oxide semiconductor.

The carrier density of a substantially intrinsic oxide semiconductor is preferably higher than or equal to $1 \times 10^5$ $cm^{-3}$ and lower than $1 \times 10^{18}$ $cm^{-3}$, further preferably higher than or equal to $1 \times 10^7$ $cm^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^3$ and lower than or equal to $1\times10^{16}$ cm$^3$, and yet still preferably higher than or equal to $1\times10^{11}$ cm$^{-3}$ and lower than or equal to $1\times10^{15}$ cm$^{-3}$.

As described above, oxide semiconductors have various structures and various properties. Note that an oxide semiconductor may be a stacked layer including two or more films of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

This embodiment can be combined with any of the other embodiments as appropriate.

(Embodiment 6)

In this embodiment, a configuration example of the memory circuit 12 is described.

Figure 21A:
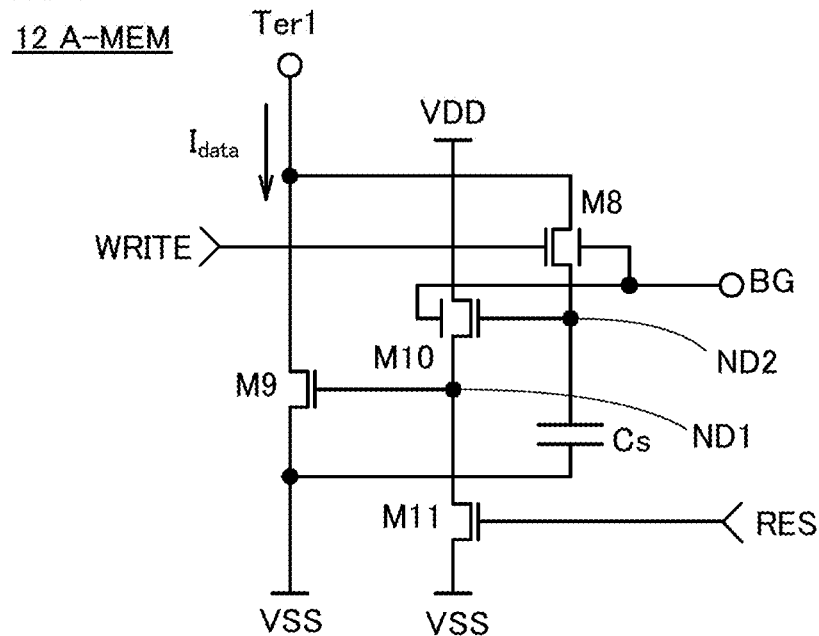
FIGS. 21A and 21B each illustrate a configuration of a memory circuit.

The memory circuit 12 illustrated in FIG. 21A is different from the memory circuit 12 illustrated in FIG. 3B in that each of the transistors M8 and M10 includes a pair of gate electrodes. In the memory circuit 12 illustrated in FIG. 21A, the first gate electrode included in each of the transistors M8 and M10 overlaps the second gate electrode (back gate electrode) with the channel formation region provided therebetween. The signal WRITE is input to the first gate electrode of the transistor M8, and the second gate electrode of the transistor M8 is electrically connected to the terminal BG. In addition, the first gate electrode of the transistor M10 is electrically connected to one electrode of the capacitor Cs, and the second gate electrode of the transistor M10 is electrically connected to the terminal BG.

Figure 21B:
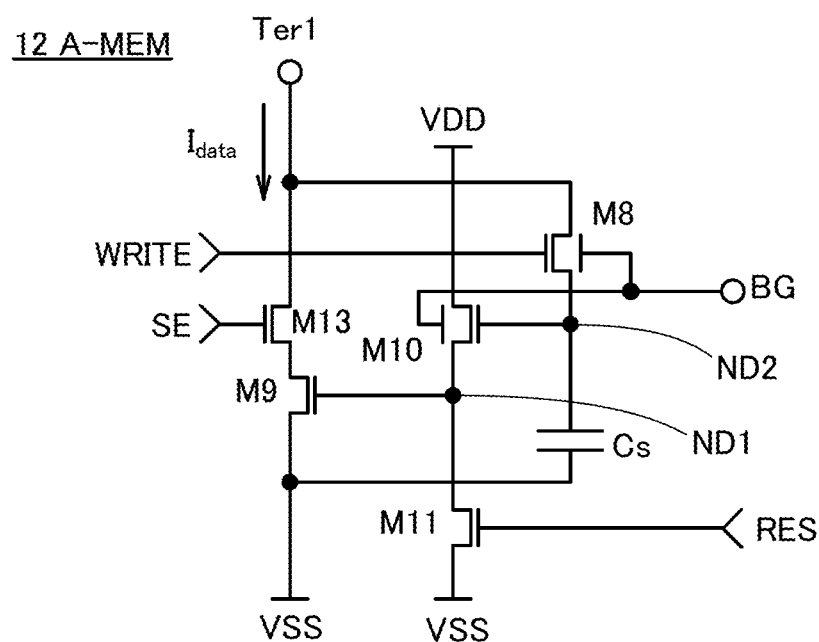

The memory circuit 12 illustrated in FIG. 21B is different from the memory circuit 12 illustrated in FIG. 4B in that the transistors M8 and M10 includes a pair of gate electrodes. In the memory circuit 12 illustrated in FIG. 21B, the first gate electrode included in the transistors M8 and M10 overlaps the second gate electrode (back gate electrode) with the channel formation region provided therebetween. The signal WRITE is input to the first gate electrode of the transistor M8, and the second gate electrode of the transistor M8 is electrically connected to the terminal BG. In addition, the first gate electrode of the transistor M10 is electrically connected to one electrode of the capacitor Cs, and the second gate electrode of the transistor M10 is electrically connected to the terminal BG.

Threshold voltage and a shift value of a transistor that includes a back gate electrode can be controlled with the potential that is supplied to the back gate electrode. Note that the term "shift value" refers to the value of the gate voltage when the drain current is $10^{-12}$ A. Specifically, when an n-channel transistor is assumed, the shift value can be made large by shifting the potential supplied to the back gate electrode to the positive side, thereby shifting the threshold voltage to the negative side. Specifically, when an n-channel transistor is assumed, the shift value can be made small by shifting the potential supplied to the back gate electrode to the negative side, thereby shifting the threshold voltage to the positive side. When the transistor is a p-channel transistor, the relationship between the potential supplied to the back gate electrode, the threshold voltage and the shift value is reversed from the case of the n-channel transistor.

Thus, for example, controlling the potential at the back gate electrode of a transistor to shift the threshold voltage to the negative side, and to increase the shift value can increase the on-state current of the transistor. This enables a quick supply of potential to the node ND2. For example, controlling the potential at the back gate electrode of a transistor to shift the threshold voltage to the positive side, and to decrease the shift value can decrease the cutoff current of the transistor. This enables a potential to be retained for a long time at the node ND2.

Note that the structures of transistors M8 and M10 described in this embodiment can be applied to the memory circuit 12 illustrated in FIG. 6.

Figure 22:
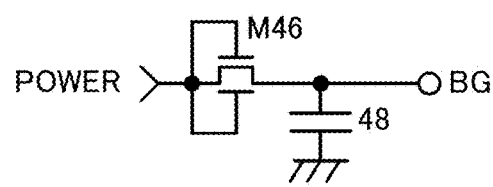
FIG. 22 illustrates a configuration of a circuit that retains a potential at a terminal BG.

Next, a configuration example of a circuit 50 that has a function of retaining a potential at the terminal BG is illustrated in FIG. 22. The circuit 50 illustrated in FIG. 22 includes a transistor M46 and a capacitor 48. A first gate electrode of the transistor M46 is electrically connected to a second gate electrode of the transistor M46. A potential is supplied from a power supply (POWER) to one of a source and a drain of the transistor M46. The other of the source and the drain of the transistor M46 is electrically connected to the terminal BG. One electrode of the capacitor 48 is electrically connected to the terminal BG, and the other electrode of the capacitor 48 is electrically connected to a node (wiring) that is supplied with a predetermined potential, such as a ground potential or a reference potential.

This embodiment can be combined with any of the other embodiments as appropriate.

(Embodiment 7)

Figure 23A:
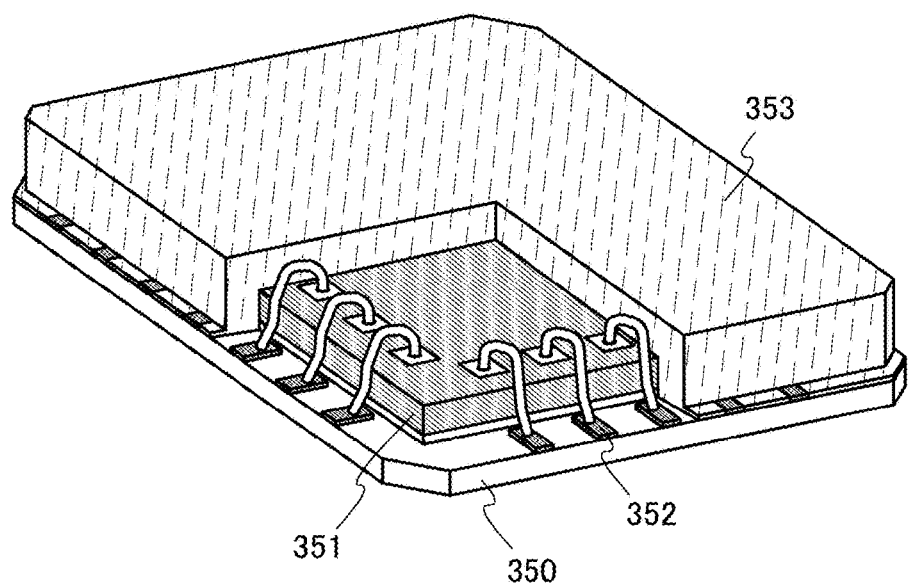
FIGS. 23A and 23B illustrate a chip and a module, respectively.

FIG. 23A is a perspective view illustrating a cross-sectional structure of a package using a lead frame interposer.

In the package in FIG. 23A, a chip 351 corresponding to the semiconductor device of one embodiment of the present invention is connected to a terminal 352 over an interposer 350 by wire bonding. The terminals 352 are placed on a surface of the interposer 350 on which the chip 351 is mounted. The chip 351 can be sealed by a mold resin 353 in which case the chip 351 is sealed so that part of each of the terminals 352 is exposed.

Figure 23B:
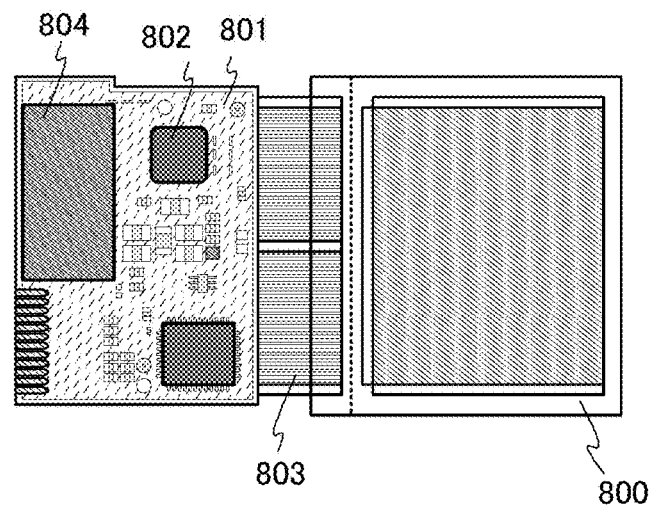

FIG. 23B illustrates the structure of a module of an electronic device in which the package is mounted on a circuit board.

In the module of a cellular phone in FIG. 23B, a package 802 and a battery 804 are mounted on a printed wiring board 801. In addition, the printed wiring board 801 is mounted on a panel 800 including display elements by an FPC 803.

Figure 25:
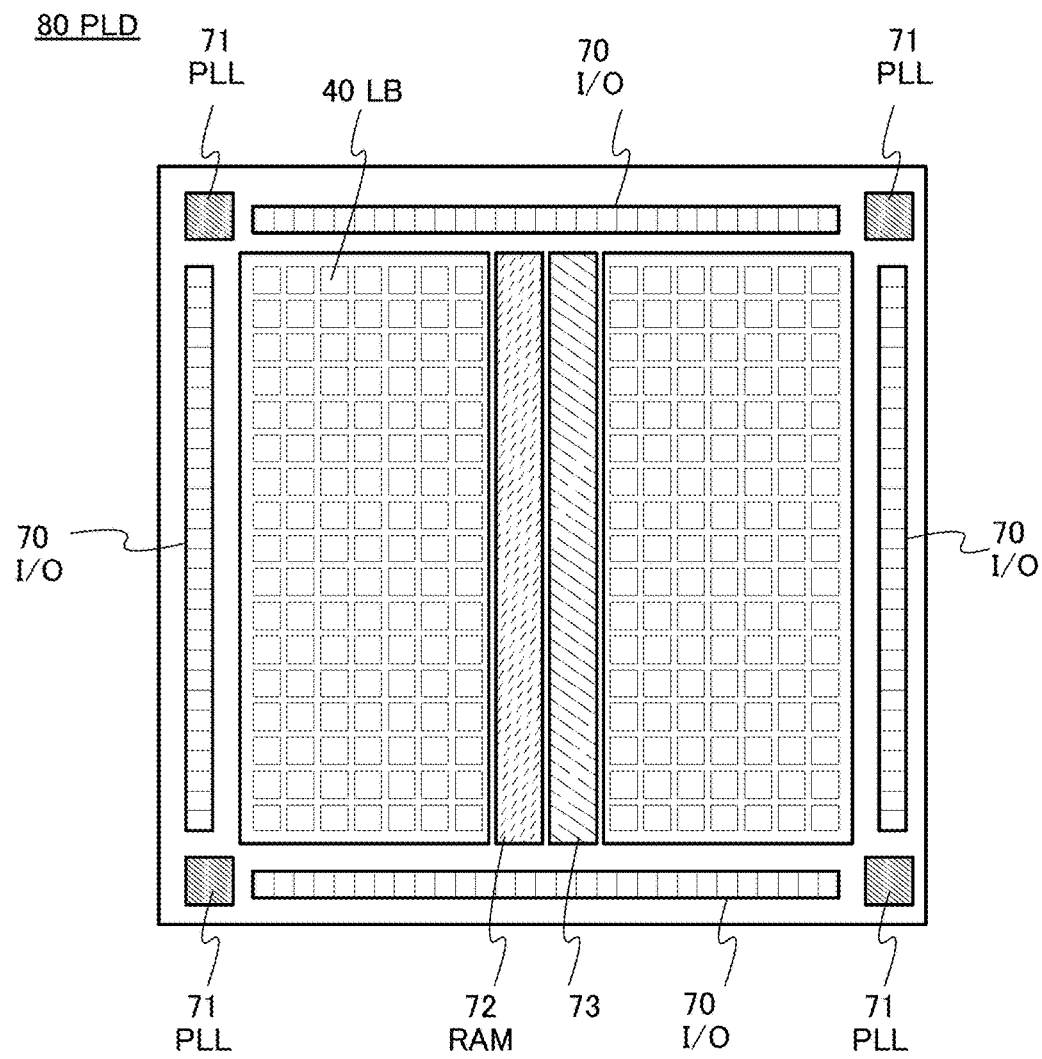
FIG. 25 illustrates a configuration of a PLD.

FIG. 25 illustrates a configuration example of a programmable logic device (PLD) on which the data comparison circuit according to one embodiment of the present invention is implemented. In FIG. 25, I/O elements 70, phase lock loops (PLL) 71, a RAM 72, and a data comparison circuit 73 are provided in the PLD 80. The I/O element 70 functions as an interface that controls input and output of signals from and to an external circuit of the PLD 80. The PLL 71 has a function of generating a signal CLK. The RAM 72 has a function of storing data used for logical operation. The data comparison circuit 73 serves as a subtractor circuit.

This embodiment can be combined with any of the other embodiments as appropriate.

(Embodiment 8)

A storage device in one embodiment of the present invention can be used for display devices, personal computers, or image reproducing devices provided with recording media (typically, devices that reproduce the content of recording media such as digital versatile discs (DVDs) and have displays for displaying the reproduced images). Other than the above, as an electronic device which can be provided with the memory device according to one embodiment of the present invention, mobile phones, game machines (including portable game machines), portable information terminals, e-book readers, video cameras, cameras (e.g. digital still cameras), goggle-type displays (head mounted displays), navigation systems, audio reproducing devices (e.g., car audio units and digital audio players), copiers, facsimiles, printers, multifunction printers, automated teller machines (ATM), vending machines, medical equipment and the like can be given. FIGS. 24A to 24F illustrate specific examples of these electronic devices.

Figure 24A:
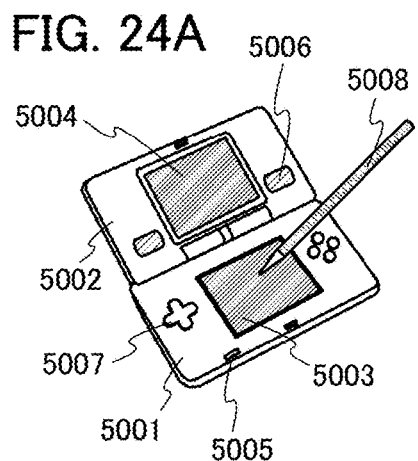
FIGS. 24A to 24F each illustrate an electronic device.

FIG. 24A illustrates a portable game machine, which includes a housing 5001, a housing 5002, a display portion 5003, a display portion 5004, a microphone 5005, speakers 5006, an operation key 5007, a stylus 5008, and the like. The memory device of one embodiment of the present invention can be used for a variety of integrated circuits included in portable game machines. Note that although the portable game console illustrated in FIG. 24A has the two display portions 5003 and 5004, the number of display portions included in the portable game console is not limited to two.

Figure 24B:
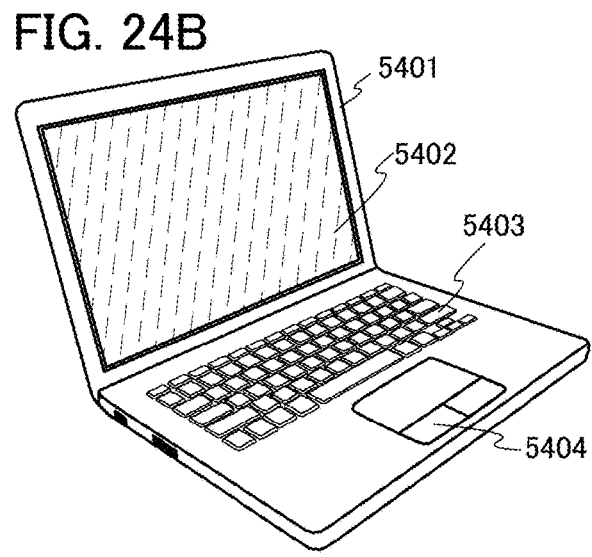

FIG. 24B illustrates a laptop type personal computer, which includes a housing 5401, a display portion 5402, a keyboard 5403, a pointing device 5404, and the like. The semiconductor device of one embodiment of the present invention can be used for a variety of integrated circuits included in laptop type personal computers.

Figure 24C:
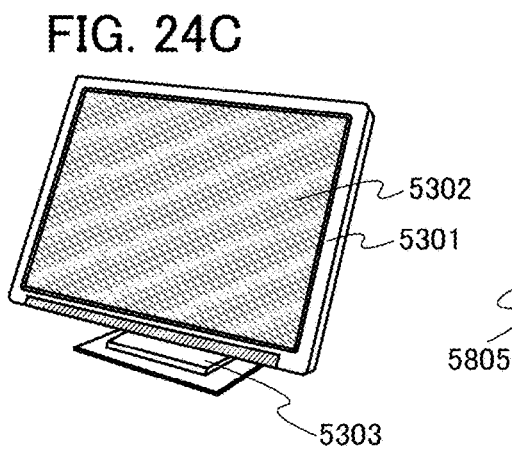

FIG. 24C illustrates a display device including a housing 5301, a display portion 5302, a supporting base 5303, and the like. The light-emitting device according to one embodiment of the present invention can be used for the image display portion 5302. Note that the display device includes all display devices for displaying information, such as display devices for personal computers, display devices for receiving TV broadcasts, and display devices for displaying advertisements.

Figure 24D:
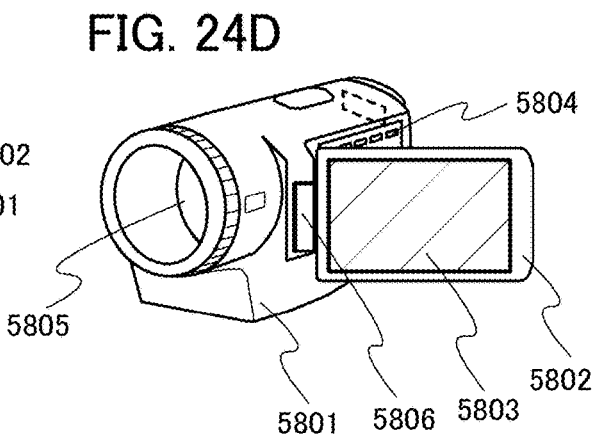

FIG. 24D illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 24E:
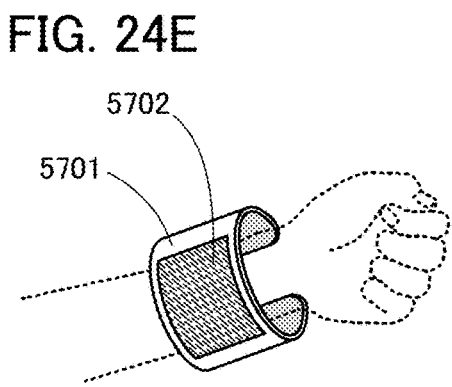

FIG. 24E illustrates a display device, which includes a housing 5701 having a curved surface, a display portion 5702, and the like. When a flexible substrate is used for the light-emitting device according to one embodiment of the present invention, it is possible to use the light-emitting device as the display portion 5702 supported by the housing 5701 having a curved surface. It is thus possible to provide a user-friendly display device that is flexible and lightweight.

Figure 24F:
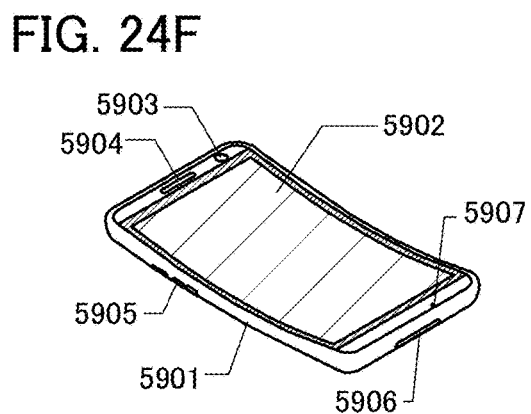

FIG. 24F illustrates a mobile phone, which includes a display portion 5902, a microphone 5907, a speaker 5904, a camera 5903, an external connection port 5906, and an operation button 5905 in a housing 5901 with a curved surface. The memory device of one embodiment of the present invention can be used for a variety of integrated circuits for controlling operation of the display device used as the display portion 5902.

This embodiment can be combined with any of the other embodiments as appropriate.

This application is based on Japanese Patent Application serial No. 2016-031740 filed with Japan Patent Office on Feb. 23, 2016, the entire contents of which are hereby incorporated by reference.

What is claimed is:

1. A data comparison circuit comprising: a first circuit; a second circuit; and a third circuit, wherein the first circuit is configured to convert first data comprising a digital voltage value to second data comprising an analog current value, wherein the second circuit is configured to store third data comprising an analog current value, wherein the third circuit is configured to generate data that indicate whether the analog current value of the second data and the analog current value of the third data match, wherein the third circuit comprises a current comparison circuit, wherein the current comparison circuit comprises an output terminal, and wherein a potential at the output terminal oscillates at an oscillation frequency.

2. The data comparison circuit according to claim 1,
wherein the first circuit comprises a current-mirror circuit, a first transistor and a second transistor,
wherein one of a source and a drain of the first transistor is electrically connected to one of a source and a drain of the second transistor,
wherein the other of the source and the drain of the first transistor is electrically connected to the other of the source and the drain of the second transistor, and
wherein the current-mirror circuit is electrically connected to the one of the source and the drain of the first transistor and the one of the source and the drain of the second transistor.

3. The data comparison circuit according to claim 2, wherein a channel width of the first transistor is different from a channel width of the second transistor.

4. The data comparison circuit according to claim 1,
wherein the second circuit comprises a first transistor, a second transistor, and a capacitor, and
wherein one of a source and a drain of the first transistor and a gate of the second transistor are electrically connected to one electrode of the capacitor.

5. The data comparison circuit according to claim 4, wherein at least one of the first transistor and the second transistor comprises an oxide semiconductor material in a channel formation region.

6. The data comparison circuit according to claim 1,
wherein the third circuit comprises a determination circuit,
wherein the current comparison circuit comprises a first transistor, a second transistor, a first comparator and a second comparator,
wherein the determination circuit comprises a third transistor and a fourth transistor,
wherein the first transistor is electrically connected to an input terminal of the first comparator,
wherein the second transistor is electrically connected to an input terminal of the second comparator,
wherein an output terminal of the first comparator is electrically connected to a gate of the third transistor, and
wherein an output terminal of the second comparator is electrically connected to a gate of the fourth transistor.

7. A data comparison circuit comprising: a first circuit; a second circuit; and a third circuit, wherein the first circuit is configured to convert first data comprising a digital voltage value to second data comprising an analog current value, wherein the second circuit is configured to store third data comprising an analog current value, wherein the third circuit is configured to detect a difference between the analog current value of the second data and the analog current value of the third data, wherein the third circuit is configured to generate data that indicates whether the second data and the third data match, using the difference, wherein the third circuit comprises a current comparison circuit, wherein the current comparison circuit comprises an output terminal, and wherein a potential at the output terminal oscillates at an oscillation frequency.

8. The data comparison circuit according to claim 7,
wherein the first circuit comprises a current-mirror circuit, a first transistor and a second transistor,
wherein one of a source and a drain of the first transistor is electrically connected to one of a source and a drain of the second transistor,
wherein the other of the source and the drain of the first transistor is electrically connected to the other of the source and the drain of the second transistor, and
wherein the current-mirror circuit is electrically connected to the one of the source and the drain of the first transistor and the one of the source and the drain of the second transistor.

9. The data comparison circuit according to claim 8, wherein a channel width of the first transistor is different from a channel width of the second transistor.

10. The data comparison circuit according to claim 7,
wherein the second circuit comprises a first transistor, a second transistor, and a capacitor, and
wherein one of a source and a drain of the first transistor and a gate of the second transistor are electrically connected to one electrode of the capacitor.

11. The data comparison circuit according to claim 10, wherein at least one of the first transistor and the second transistor comprises an oxide semiconductor material in a channel formation region.

12. The data comparison circuit according to claim 7,
wherein the third circuit comprises a determination circuit,
wherein the current comparison circuit comprises a first transistor, a second transistor, a first comparator and a second comparator,
wherein the determination circuit comprises a third transistor and a fourth transistor,
wherein the first transistor is electrically connected to an input terminal of the first comparator,
wherein the second transistor is electrically connected to an input terminal of the second comparator,
wherein an output terminal of the first comparator is electrically connected to a gate of the third transistor, and
wherein an output terminal of the second comparator is electrically connected to a gate of the fourth transistor.

13. A data comparison circuit comprising: a first circuit; a second circuit; and a third circuit, wherein the first circuit is configured to convert first data comprising a digital voltage value to second data comprising an analog current value, wherein the second circuit is configured to store third data comprising an analog current value, wherein the third circuit is configured to detect a difference between the analog current value of the second data and the analog current value of the third data, wherein the third circuit is configured to generate fourth data that includes information about the difference, wherein the third circuit comprises a current comparison circuit, wherein the current comparison circuit comprises an output terminal, and wherein a potential at the output terminal oscillates at an oscillation frequency.

14. The data comparison circuit according to claim 13,
wherein the first circuit comprises a current-mirror circuit, a first transistor and a second transistor,
wherein one of a source and a drain of the first transistor is electrically connected to one of a source and a drain of the second transistor,
wherein the other of the source and the drain of the first transistor is electrically connected to the other of the source and the drain of the second transistor, and
wherein the current-mirror circuit is electrically connected to the one of the source and the drain of the first transistor and the one of the source and the drain of the second transistor.

15. The data comparison circuit according to claim 14, wherein a channel width of the first transistor is different from a channel width of the second transistor.

16. The data comparison circuit according to claim 13,
wherein the second circuit comprises a first transistor, a second transistor, and a capacitor, and
wherein one of a source and a drain of the first transistor and a gate of the second transistor are electrically connected to one electrode of the capacitor.

17. The data comparison circuit according to claim 16, wherein at least one of the first transistor and the second transistor comprises an oxide semiconductor material in a channel formation region.

18. The data comparison circuit according to claim 13,
wherein the third circuit comprises a determination circuit,
wherein the current comparison circuit comprises a first transistor, a second transistor, a first comparator and a second comparator,
wherein the determination circuit comprises a third transistor and a fourth transistor,
wherein the first transistor is electrically connected to an input terminal of the first comparator,
wherein the second transistor is electrically connected to an input terminal of the second comparator,
wherein an output terminal of the first comparator is electrically connected to a gate of the third transistor, and
wherein an output terminal of the second comparator is electrically connected to a gate of the fourth transistor.

* * * * *